(12) United States Patent
Park et al.

(10) Patent No.: US 9,801,275 B2
(45) Date of Patent: Oct. 24, 2017

(54) PRINTED CIRCUIT BOARD AND METHOD OF MANUFACTURING THE SAME

(71) Applicant: LG INNOTEK CO., LTD., Seoul (KR)

(72) Inventors: Chung Sik Park, Seoul (KR); Jae Hwa Kim, Seoul (KR); Heun Gun Shin, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/621,998

(22) Filed: Feb. 13, 2015

(65) Prior Publication Data

US 2015/0237728 A1 Aug. 20, 2015

(30) Foreign Application Priority Data

Feb. 17, 2014 (KR) .................. 10-2014-0018131
Feb. 21, 2014 (KR) .................. 10-2014-0020573

(51) Int. Cl.
*H05K 1/11* (2006.01)
*H05K 3/00* (2006.01)

(52) U.S. Cl.
CPC ............ *H05K 1/113* (2013.01); *H05K 3/0044* (2013.01); *H05K 2201/09618* (2013.01); *Y10T 29/49155* (2015.01)

(58) Field of Classification Search
CPC .................................................. H05K 3/4046
USPC ....................................................... 174/265
See application file for complete search history.

(56) References Cited

U.S. PATENT DOCUMENTS

| | | |
|---|---|---|
| 6,517,924 B1 | 2/2003 | Kameda et al. |
| 2002/0061629 A1 | 5/2002 | Nishide et al. |
| 2002/0179332 A1 | 12/2002 | Uematsu et al. |
| 2003/0209796 A1 | 11/2003 | Kondo et al. |
| 2005/0178585 A1 | 8/2005 | Kim et al. |
| 2007/0033457 A1* | 2/2007 | Park ................ H05K 1/115 714/724 |
| 2007/0108586 A1 | 5/2007 | Uematsu et al. |
| 2009/0188703 A1* | 7/2009 | Ito ............. H01L 23/49838 174/255 |
| 2010/0012366 A1* | 1/2010 | Takeda .............. H05K 3/429 174/261 |
| 2010/0212947 A1 | 8/2010 | Yamanaka et al. |
| 2011/0273855 A1 | 11/2011 | Kim et al. |

(Continued)

FOREIGN PATENT DOCUMENTS

EP 0 954 209 A1 11/1999
WO WO 2013141339 A1 9/2013

OTHER PUBLICATIONS

European Search Report issued in Application No. 15155421.9 dated Jul. 24, 2015.

*Primary Examiner* — Hoa C Nguyen
*Assistant Examiner* — Stanley Tso
(74) *Attorney, Agent, or Firm* — KED & Associates, LLP

(57) ABSTRACT

A printed circuit board according to the embodiment includes an insulating layer; a first pad on a top surface of the insulating layer; a second pad on a bottom surface of the insulating layer; and a via formed in the insulating layer and having one surface connected to the first pad and an opposite surface connected to the second pad, wherein the via includes a plurality of via parts which are at least partially overlapped with each other.

6 Claims, 23 Drawing Sheets

(56) References Cited

U.S. PATENT DOCUMENTS

2013/0319737 A1* 12/2013 Hurwitz .............. H01L 23/3677
174/257

* cited by examiner

PRINTED CIRCUIT BOARD AND METHOD OF MANUFACTURING THE SAME

CROSS-REFERENCE TO RELATED APPLICATIONS

This application claims priority under 35 U.S.C. §119 to Korean Application Nos. 10-2014-0018131 filed on Feb. 17, 2014 and 10-2014-0020573 filed on Feb. 21, 2014, whose entire disclosures are incorporated herein by reference.

BACKGROUND

1. Field

The disclosure relates to a printed circuit board and a method of manufacturing the same.

2. Background

A printed circuit board (PCB) is formed by printing a circuit pattern on an electrical insulating substrate by using a conductive material such as copper (Cu), and refers to a board right before electronic parts are mounted thereon. In other words, the PCB refers to a circuit board in which the mounting positions of the electronic parts are determined, and a circuit pattern connecting the electronic parts to each other is fixedly printed on the surface of a flat plate so that several types of many electronic devices are densely mounted on the flat plate.

Recently, as the electronic industry has been developed, demands for high functional and small-sized electronic components with price competitiveness and short delivery period have been increased. For this reason, PCB manufactures employ a semi-additive process (SAP) to satisfy the trend of slimness and high compactness of the PCB.

Meanwhile, a conductive via is formed in the PCB for electric conduction between layers. In addition, recently, a large via (which is also called bar via) having a size larger than a size of a normal bar has been developed by taking the heat dissipation performance of the PCB into consideration.

That is, in the case of a coreless substrate, the RF value, CW gain, CW output and CW efficiency may be determined according to the heat dissipation performance. In the case of PCB, a stack via is formed from an uppermost layer to a lowermost layer of a package in order to easily dissipate heat.

FIGS. 1 to 3 are sectional views showing a via structure of a PCB according to the related art. FIG. 1 shows a normal stack via structure according to the related art, FIG. 2 shows a rod-type via structure according to the related art, and FIG. 3 shows a pyramid-type via structure according to the related art.

Referring to FIG. 1, the PCB includes a plurality of insulating layers 1 connected with each other, inner layer pads 2 disposed between two different insulating layers, outer layer pads 3 formed on surfaces of an uppermost insulating layer and a lowermost insulating layer, and a plurality of vias formed in the insulating layers 1, respectively.

The vias include a first via 4, a second via 5, a third via 6, and a fourth via 7, which are spaced apart from each other by a predetermined interval. The first to fourth vias 4 to 7 are commonly connected to the inner layer pad 2 and the outer layer pad 4.

Referring to FIG. 2, the PCB includes a plurality of insulating layers 1 connected with each other, inner layer pads 12 disposed between two different insulating layers, outer layer pads 13 formed on surfaces of an uppermost insulating layer and a lowermost insulating layer, and vias 14 formed in the insulating layers 11, respectively.

The via 14 has a width wider than a width of a normal via. For example, the via 14 may have a width corresponding to the sum of widths of the first to fourth vias 4 to 7 shown in FIG. 1.

As shown in the bottom of FIG. 2, the via 14 may have a shape corresponding to a via hole by plating the via hole having a wide cylindrical shape with a metallic material.

Referring to FIG. 3, the PCB includes a plurality of insulating layers 21 connected with each other, inner layer pads 22 disposed between two different insulating layers, outer layer pads 23 formed on surfaces of an uppermost insulating layer and a lowermost insulating layer, and vias 24 formed in the insulating layers 21, respectively.

The vias 24 formed in the insulating layers 21 may have mutually different widths.

For example, the via formed in the central insulating layer may have a first width, the vias formed in upper insulating layers may have a second width wider than the first width, and the vias formed in the lower insulating layers may have a third width wider than the first width. At this time, the third width may be wider than the second width.

However, the rod-type via or the pyramid-type via has a volume relatively larger than a volume of a normal stack via as well as a long length, so a dimple may occur in the plating process.

FIG. 4 shows a via according to the related art.

Referring to FIG. 4, the via may have a concave shape D, in which a center region is lower than a peripheral region, and the concave shape is called a dimple phenomenon.

According to the related art, the plating process is performed several times in order to diminish the dimple phenomenon. However, if the plating process is performed several times, the lead time for the product may be increased.

BRIEF DESCRIPTION OF THE DRAWINGS

The embodiments will be described in detail with reference to the following drawings in which like reference numerals refer to like elements wherein.

DETAILED DESCRIPTION

Figure 1:
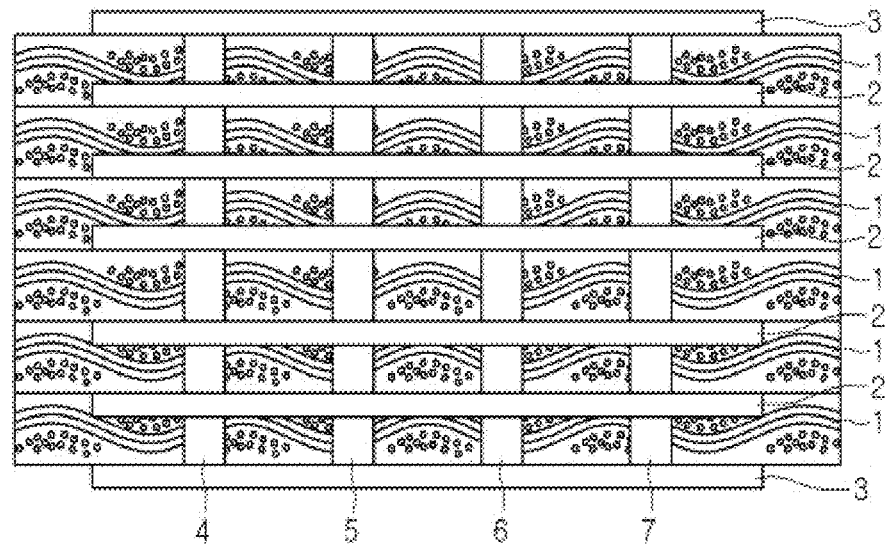
FIGS. 1 to 3 are sectional views showing a via structure of a PCB according to the related art.
Figure 2:
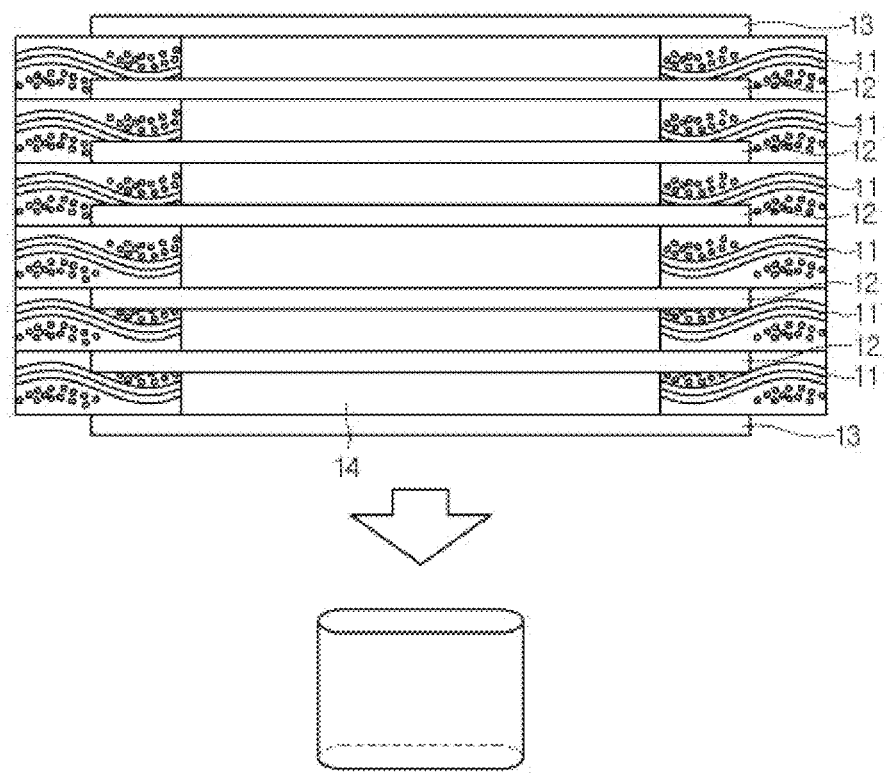
Figure 3:
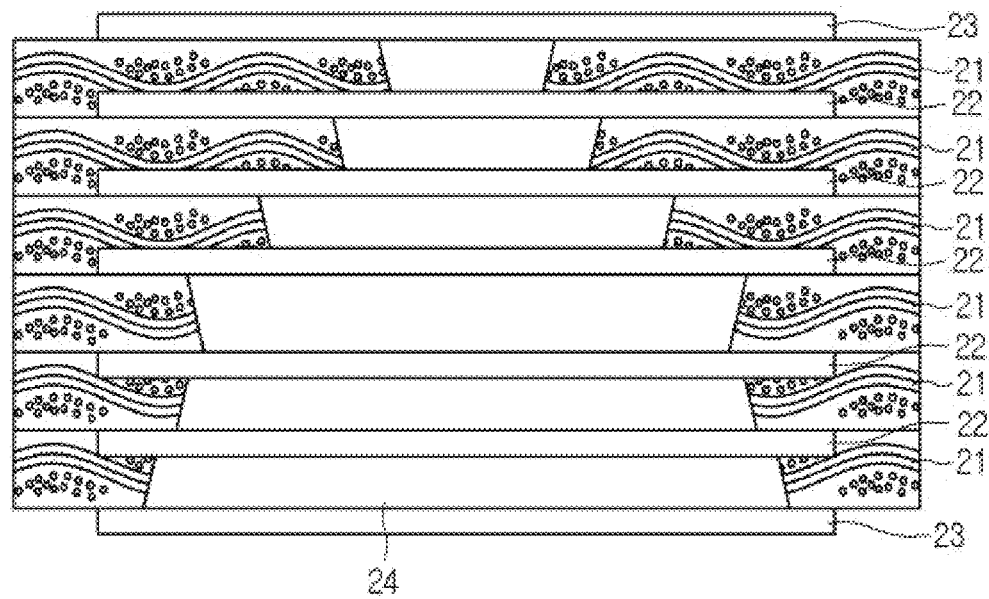
Figure 4:
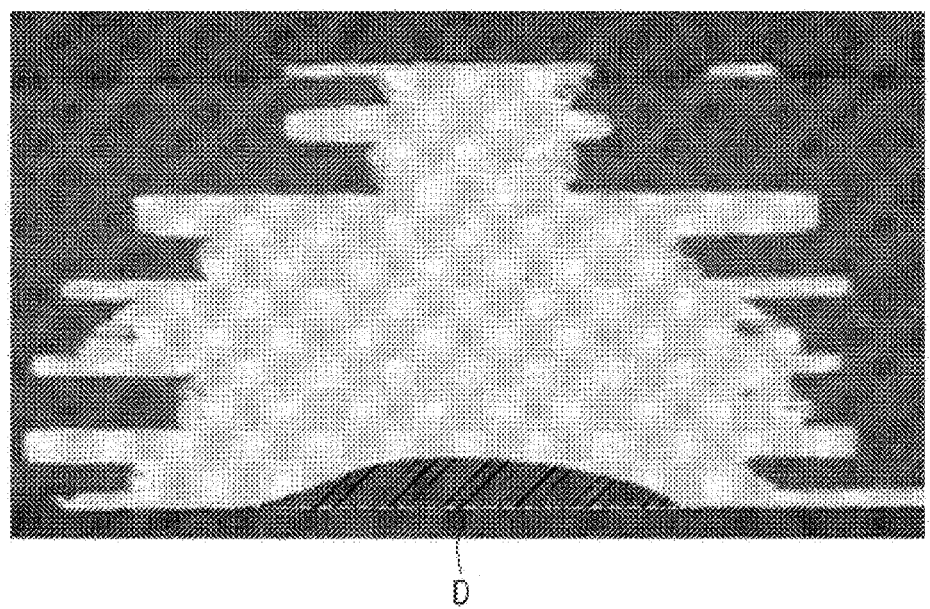
FIG. 4 is a view showing a via according to the related art.

Hereinafter, embodiments will be described in detail with reference to accompanying drawings so that those skilled in the art can easily work with the embodiments. However, the embodiments may not be limited to the above, but have various modifications.

In the following description, when a predetermined part "includes" a predetermined component, the predetermined part does not exclude other components, but may further include other components if there is a specific opposite description.

The thickness and size of each layer shown in the drawings may be exaggerated, omitted or schematically drawn for the purpose of convenience or clarity. In addition, the size of elements does not utterly reflect an actual size. The same reference numbers will be assigned the same elements throughout the drawings.

In the description of the embodiments, it will be understood that, when a layer, a film, a region, or a plate is referred to as being "on" or "under" another layer, another film, another region, or another plate, it can be "directly" or "indirectly" on the other layer, film, region, plate, or one or more intervening layers may also be present. On the contrary, if a part is directly positioned on another part, it refers to that there is no intervening part between the part and another part.

Figure 5:
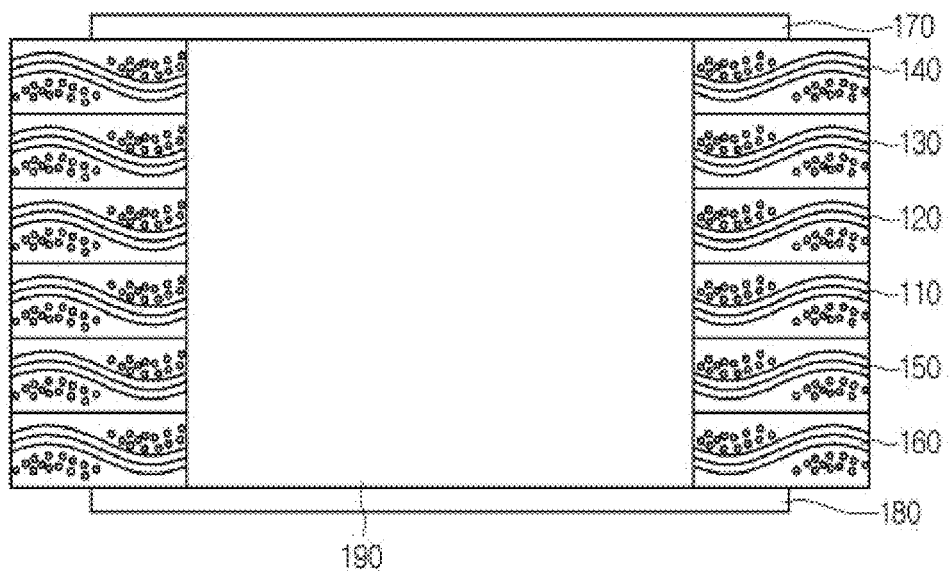
FIG. 5 is a sectional view showing a PCB according to a first embodiment.

FIG. 5 is a sectional view showing a printed circuit board (PCB) according to a first embodiment.

Referring to FIG. 5, the PCB 100 may include an insulating substrate having a first insulating layer 110, a second insulating layer 120, a third insulating layer 130, a fourth insulating layer 140, a fifth insulating layer 150, and a sixth insulating layer 160, a first pad 170 formed on a surface of the uppermost insulating layer, a second pad 180 formed on a surface of the lowermost insulating layer and a via 190 filled in a via hole formed through the uppermost insulating layer and the lowermost insulating layer.

The first insulating layer 110, the second insulating layer 120, the third insulating layer 130, the fourth insulating layer 140, the fifth insulating layer 150, and the sixth insulating layer 160 may constitute an insulating plate and may include a thermosetting or thermoplastic polymeric substrate, a ceramic substrate, an organic-inorganic composite substrate, or a glass fiber impregnated substrate. If the insulating layers include the polymeric resin, the insulating layers may include epoxy insulating resin, such as FR-4, Bismaleimide Triazine (BT), or Ajinomoto Build up Film (ABF). Alternatively, the insulating layers may include polyimide based resin, but the embodiment is not limited thereto.

The first insulating layer 110, the second insulating layer 120, the third insulating layer 130, the fourth insulating layer 140, the fifth insulating layer 150 and the sixth insulating layer 160 may include the same material, and preferably, may include an insulating sheet formed of only resin.

The first insulating layer 110 may be a base insulating layer. The base insulating layer may refer to an insulating layer which is primarily formed in the stack structure including the first insulating layer 110, the second insulating layer 120, the third insulating layer 130, the fourth insulating layer 140, the fifth insulating layer 150, and the sixth insulating layer 160.

Although not shown in the drawing, a circuit pattern may be formed on a surface of at least one of the first insulating layer 110, the second insulating layer 120, the third insulating layer 130, the fourth insulating layer 140, the fifth insulating layer 150, and the sixth insulating layer 160.

The circuit pattern may be formed through typical processes of fabricating the printed circuit board, such as an additive process, a subtractive process, a modified semi-additive process (MSAP), and a semi-additive process, and the details thereof will be omitted.

In addition, although not shown in the drawing, an interlayer conduction via may be formed in order to connect the circuit patterns formed on the surface of at least one of the first insulating layer 110, the second insulating layer 120, the third insulating layer 130, the fourth insulating layer 140, the fifth insulating layer 150, and the sixth insulating layer 160.

The circuit pattern and the interlayer conduction via may be formed through the technique generally known in the art and the circuit pattern and the interlayer conduction via may be essential elements of the PCB substantially, so the detailed illustration and description thereof will be omitted.

The first pad is formed on the top surface of the fourth insulating layer 140, which is the uppermost layer among the insulating layers. The first pad 170 may be connected to one surface of the via 190.

In addition, the first pad 170 may have a width wider than a width of the via 190. Preferably, the first pad 170 may expanded to the surface of the fourth insulating layer 140.

A thermal element may be attached onto the first pad 170 and heat generated from the thermal element may be transferred to the second pad 180 formed on the lowermost layer through the first pad 170 and the via 190.

The second pad 180 may be formed on the bottom surface of the sixth insulating layer 160, which is the lowermost layer among the insulating layers. Similar to the first pad 170, the second pad 180 may be connected to the via 190. Preferably, one surface of the via 190 may be connected to the first pad 170 and the other surface of the via 190 may be connected to the second pad 180.

The via 190 may be formed in the insulating layers.

The via 190 may be formed by filling metallic material in the via hole (described later) formed through the insulating layers.

The via 190 may have a plurality of parts connected to each other.

Figure 7:
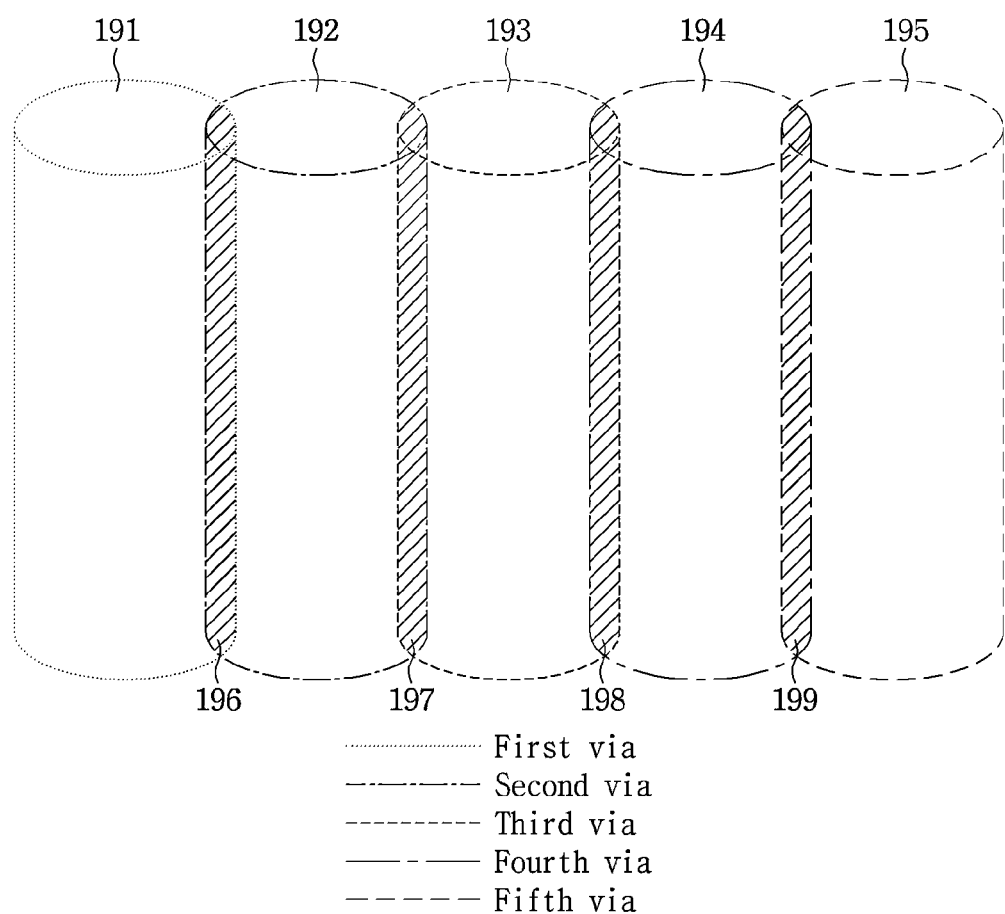
FIG. 7 is a pictorial view of vias shown in FIG. 5.

In addition, the top and bottom surfaces of the via 190 may have predetermined shapes other than the circular shape of the via shown in FIG. 7.

Preferably, the via 190 may have a loop shape (snowman, peanut or FIG. 8), which may be obtained by overlapping a plurality of circles.

In other words, a plurality of via holes having circular shapes may overlap with each other in the insulating layers and the overlapped via holes may have the loop shape.

The metallic material may be filled in the via hole having the above shape, and the via 190 may be formed as the metallic material is filled in the via hole.

Hereinafter, the shape of the via 190 will be described in more detail with reference to accompanying drawings.

Figure 6:
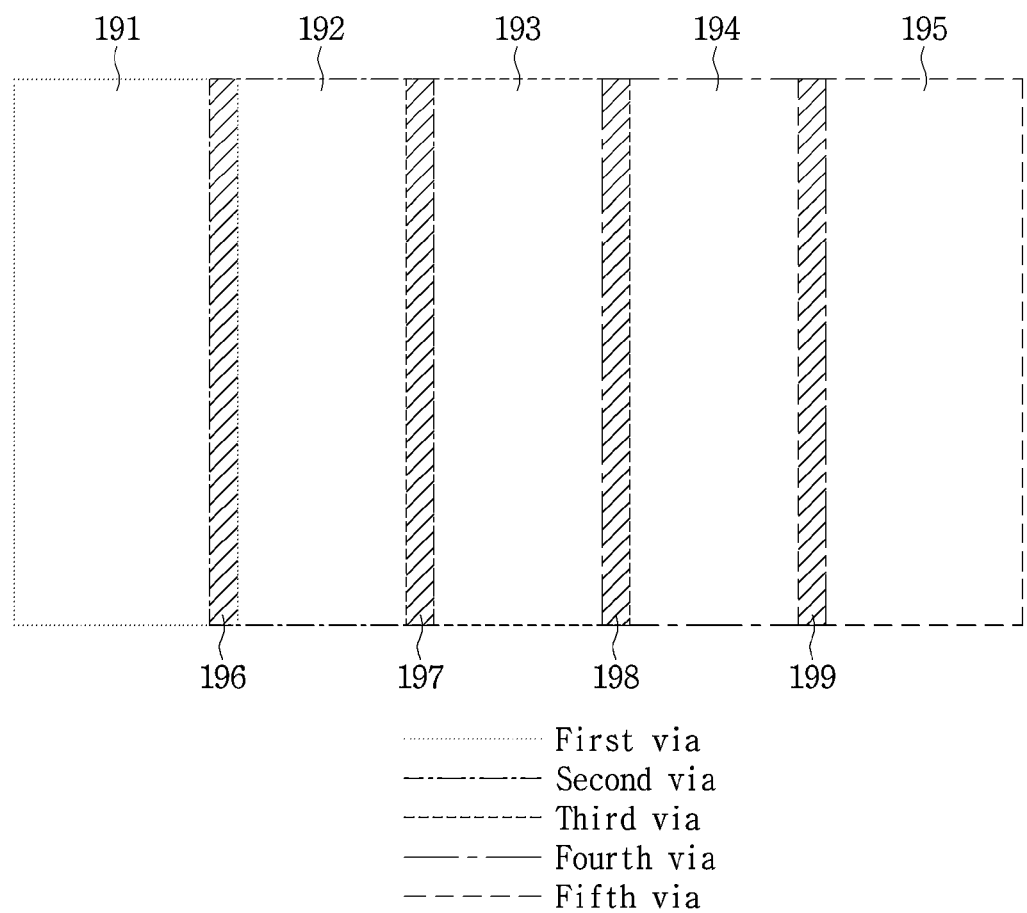
FIG. 6 is a sectional view of vias shown in FIG. 5.

FIG. 6 is a sectional view of vias shown in FIG. 5, and FIG. 7 is a pictorial view of vias shown in FIG. 5.

Referring to FIG. 6, the via 190 may include a first via part 191, a second via part 192, a third via part 193, a fourth via part 194, and a fifth via part 195.

Although the via 190 formed by overlapping five via parts is shown in the drawing, the embodiment is not limited thereto. The number of via parts may be increased or decreased. That is, the number of the via parts may be adjustable according to the width of each via part and the width of the via 190 which is finally fabricated.

The first via part 191, the second via part 192, the third via part 193, the fourth via part 194, and the fifth via part 195 may have a circular sectional shape.

In addition, the first via part 191 may have a first region overlapping with the second via part 192. In other words, the first via part 191 may partially overlap with the second via part 192.

Further, the second via part 192 may have one region overlapping with the first via part 191 and the other region overlapping with the third via part 193. That is, the second via part 192 may have a second region 197 overlapping with the third via part 193.

In addition, the third via part 193 may have one region overlapping with the second via part 192 and the other region overlapping with the fourth via part 194. That is, the third via part 193 may have a third region 198 overlapping with the fourth via part 194.

Further, the fourth via part 194 may have one region overlapping with the third via part 193 and the other region overlapping with the fifth via part 195. That is, the fourth via part 194 may have a fourth region 199 overlapping with the fifth via part 195.

As a result, the first via part 191 may have a first section, which does not overlap with other via parts, and a second section overlapping with the second via part 192.

In addition, the second via part 192 may have a first section, which does not overlap with other via parts, a second section overlapping with the first via part 191, and a third section overlapping with the third via part 193.

Further, the third via part 193 may have a first section, which does not overlap with other via parts, a second section overlapping with the second via part 192, and a third section overlapping with the fourth via part 194.

In addition, the fourth via part 194 may have a first section, which does not overlap with other via parts, a second section overlapping with the third via part 193, and a third section overlapping with the fifth via part 195.

Further, the fifth via part 195 may have a first section, which does not overlap with other via parts, and a second section overlapping with the fourth via part 194.

Since the first to fifth via parts 191 to 195 may have the circular sectional shapes, which are partially overlapped with each other, the via 190 including the first to fifth via parts 191 to 195 may have the loop shape.

Meanwhile, the first to fifth via parts 191 to 195 may include a first section formed in the first insulating layer 110, a second section formed in the second insulating layer 120, a third section formed in the third insulating layer 130, a fourth section formed in the fourth insulating layer 140, and a fifth section formed in the fifth insulating layer 150.

In this case, the first to fifth sections of the first to fifth via parts 191 to 195 may be integrally formed with each other while directly making contact with each other.

According to the embodiment, the via 190 has the loop sectional shape, so the dimple phenomenon occurring in the plating process can be diminished so that the lead time can be reduced and the process cost can be saved.

FIGS. 8 to 17 are sectional views sequentially showing a method of manufacturing a PCB according to a first embodiment.

Figure 8:
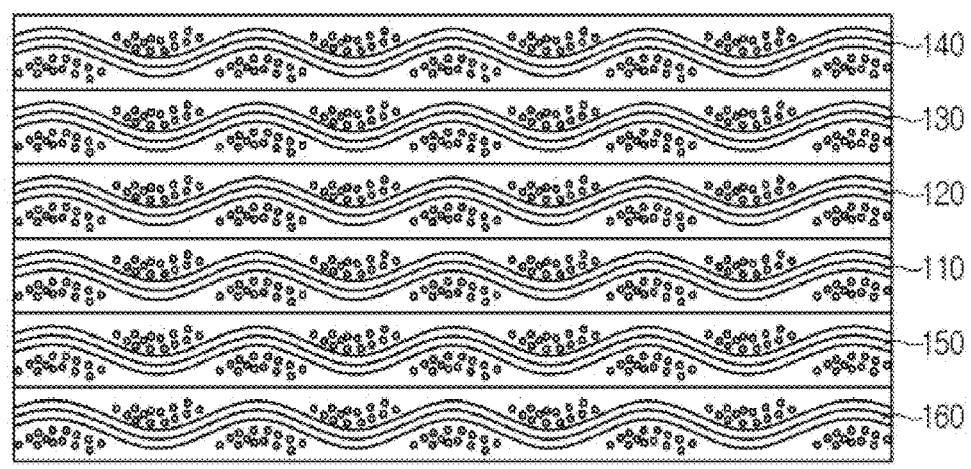
FIGS. 8 to 17 are sectional views sequentially showing a method of manufacturing a PCB according to a first embodiment.

Referring to FIG. 8, a lay-up process is performed with respect to a plurality of insulating layers.

Preferably, the first insulating layer 110 is primarily prepared. Then, the second insulating layer 120 is laminated on the first insulating layer 110, the third insulating layer 130 is laminated on the second insulating layer 120, the fourth insulating layer 140 is laminated on the third insulating layer 130, the fifth insulating layer 150 is laminated on the fourth insulating layer 140, and the sixth insulating layer 160 is laminated on the fifth insulating layer 150.

At this time, although not shown in the drawings, a plurality of circuit patterns and an interlayer conduction via, which connects the circuit patterns formed on mutually different layers with each other, may be formed during the lay-up process for the insulating layers.

The circuit pattern may be formed through typical processes of fabricating the printed circuit board, such as an additive process, a subtractive process, a modified semi-additive process (MSAP), and a semi-additive process, and the details thereof will be omitted.

In addition, the interlayer conduction via can be formed by filling the metallic material in the via hole, which is formed through at least one of mechanical, laser and chemical processes.

Figure 9:
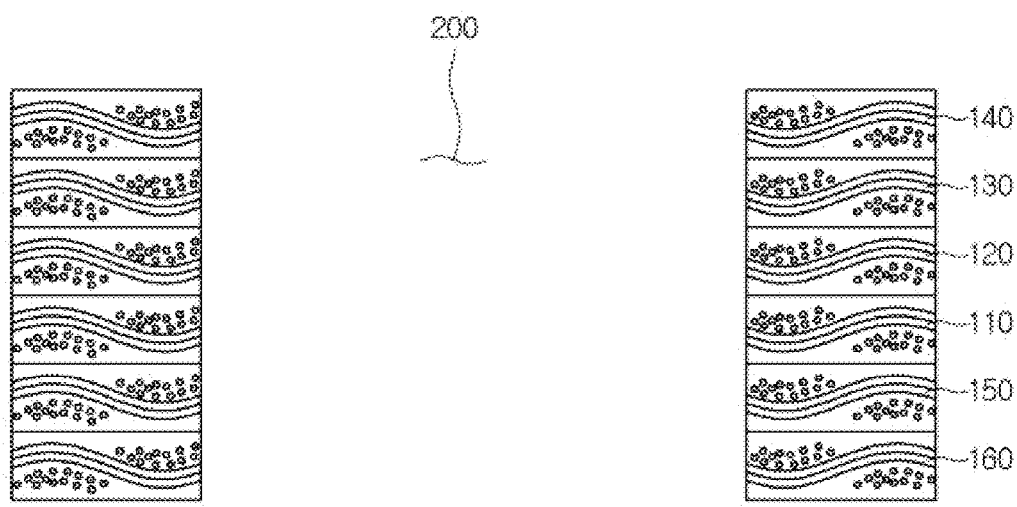

Then, referring to FIG. 9, a via hole 200 is formed through a top surface and a bottom surface of an insulating substrate including the first to sixth insulating layers 110 to 160.

The process for forming the via hole 200 may be divided into a plurality of steps. Hereinafter, the process for forming the via hole 200 will be described in more detail.

Figure 10:
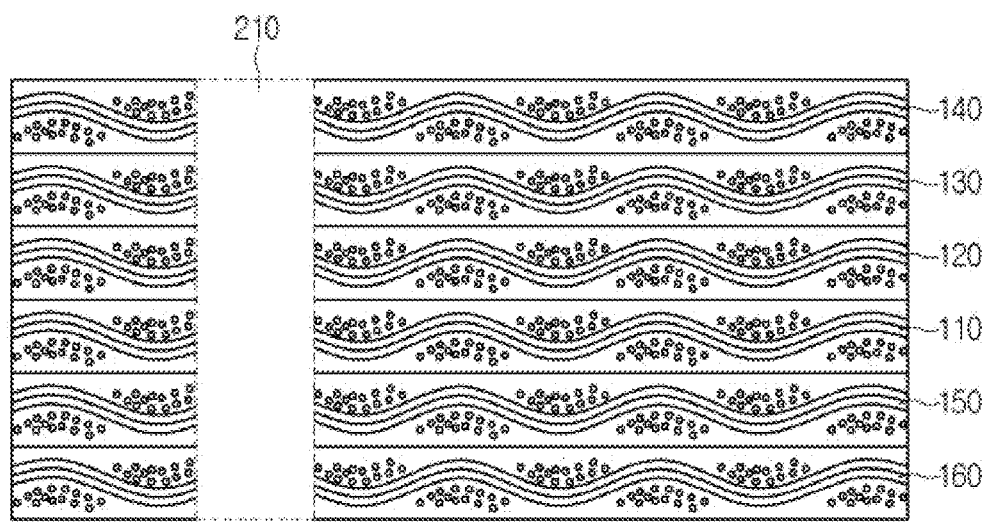

Referring to FIG. 10, a first via hole 210 is formed through the top surface and the bottom surface of the insulating substrate including the first to sixth insulating layers 110 to 160.

The first via hole 210 may be formed through the mechanical process by using a circular drill.

Thus, the first via hole 210 may have one surface formed in the fourth insulating layer 140 and the other end extending to the sixth insulating layer 160.

Figure 11:
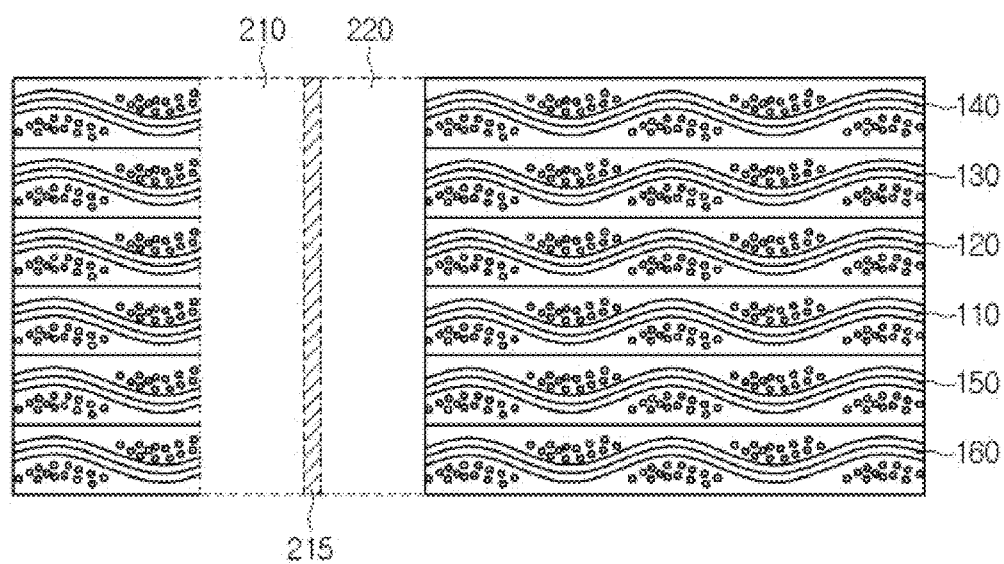

Referring to FIG. 11, a second via hole 220 is formed through the top surface and the bottom surface of the insulating substrate including the first to sixth insulating layers 110 to 160.

When forming the second via hole 220, a portion of the second via hole 220 may overlap with the first via hole 210 which is previously formed.

In other words, the circular drill used to form the second via hole 220 is placed on the top surface of the fourth insulating layer 140 and a portion of the circular drill may overlap with the first via hole 210 which is previously formed. That is, a portion of the circular drill may be placed on the first via hole 210 which is previously open.

Therefore, a first region 215 may be formed at an overlapping area between the second via hole 220 and the first via hole 210.

Figure 12:
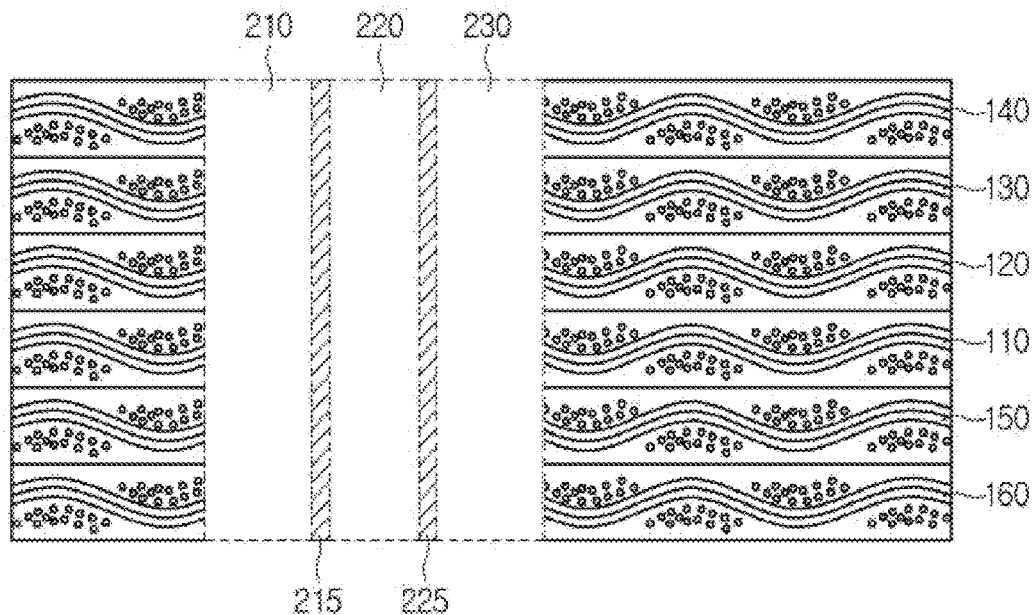

Referring to FIG. 12, a third via hole 230 is formed through the top surface and the bottom surface of the insulating substrate including the first to sixth insulating layers 110 to 160.

When forming the third via hole 230, a portion of the third via hole 230 may overlap with the second via hole 220 which is previously formed.

In other words, the circular drill used to form the third via hole 230 is placed on the top surface of the fourth insulating layer 140 and a portion of the circular drill may overlap with the second via hole 220 which is previously formed. That is, a portion of the circular drill may be placed on the second via hole 220 which is previously open.

Therefore, a second region 225 may be formed at an overlapping area between the third via hole 230 and the second via hole 220.

Figure 13:
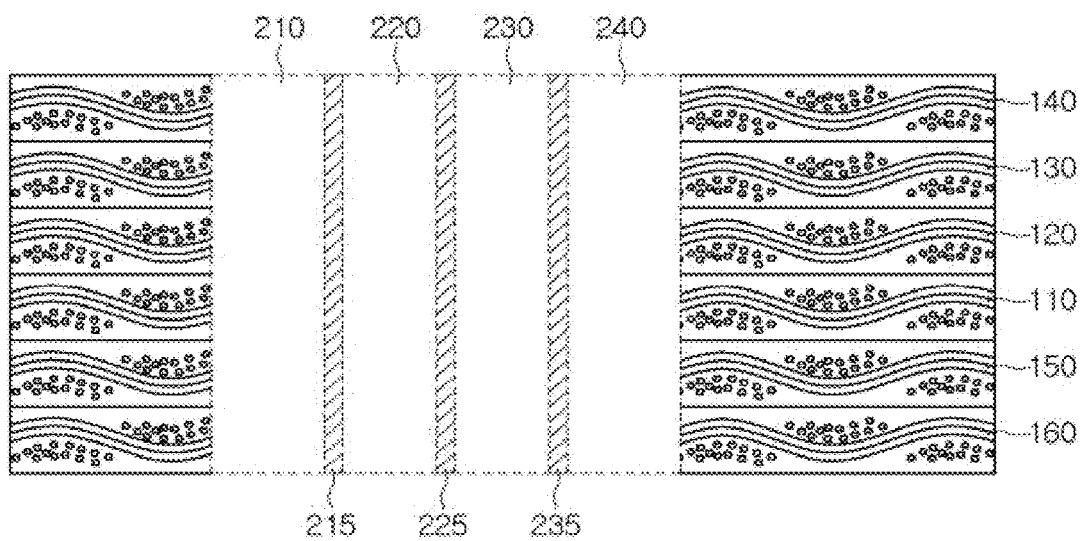

Referring to FIG. 13, a fourth via hole 240 is formed through the top surface and the bottom surface of the insulating substrate including the first to sixth insulating layers 110 to 160.

When forming the fourth via hole 240, a portion of the fourth via hole 240 may overlap with the third via hole 230 which is previously formed.

Therefore, a third region 235 may be formed at an overlapping area between the fourth via hole 240 and the third via hole 230.

Figure 14:
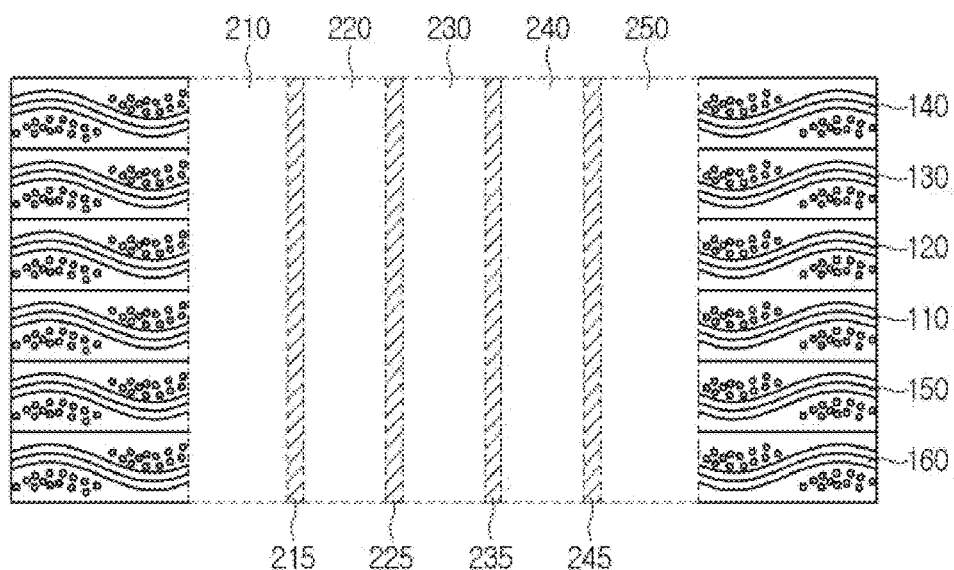

Referring to FIG. 14, a fifth via hole 250 is formed through the top surface and the bottom surface of the insulating substrate including the first to sixth insulating layers 110 to 160.

When forming the fifth via hole 250, a portion of the fifth via hole 250 may overlap with the fourth via hole 240 which is previously formed.

Therefore, a fourth region 245 may be formed at an overlapping area between the fifth via hole 250 and the fourth via hole 240.

The first via hole 210, the second via hole 220, the third via hole 230, the fourth via hole 240, and the fifth via hole 250 formed through the above process are combined with each other to form one via hole 200. In this case, the via hole 200 may have a loop sectional shape.

Figure 15:
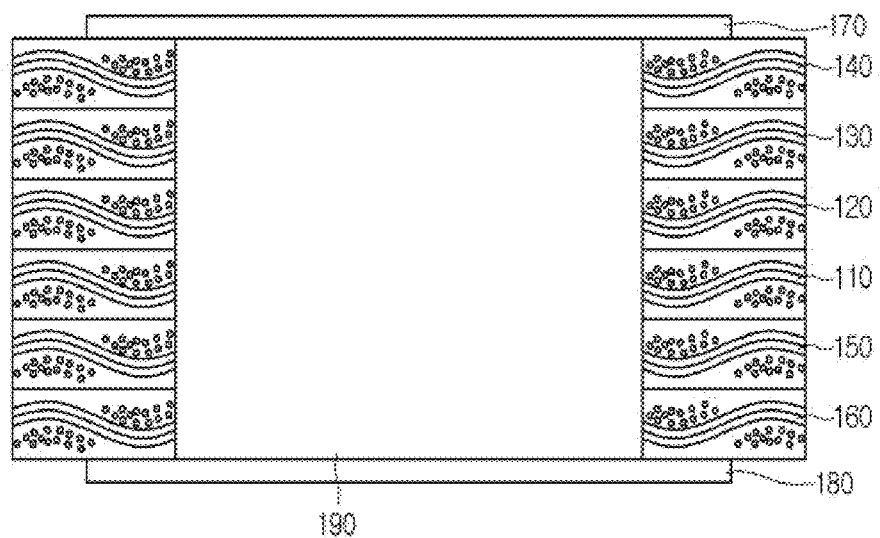

Referring to FIG. 15, the metallic material is filled in the via hole 200 so that the via 190 is formed. In addition, the first pad 170 is formed on the top surface of the fourth insulating layer 140 and the second pad 180 is formed on the bottom surface of the sixth insulating layer 160.

The via 190 may include any one selected from Cu, Ag, Sn, Au, Ni and Pd and may be formed through any one of an electroless plating scheme, an electrolytic plating scheme, a screen printing scheme, a sputtering scheme, an evaporation scheme, an ink-jet scheme, and a dispensing scheme or the combination thereof.

Preferably, the via 190 may be formed through the electrolytic plating scheme.

If the via 190 is formed through the electrolytic plating scheme, a plating layer (not shown) may be previously formed before the via 190 is formed. The plating layer may be formed on the top surface of the uppermost insulating layer, an inner wall of the via hole 200 and the bottom surface of the lowermost insulating layer.

In addition, a portion of the plating layer may constitute the first pad 170 and the second pad 180.

Figure 16:
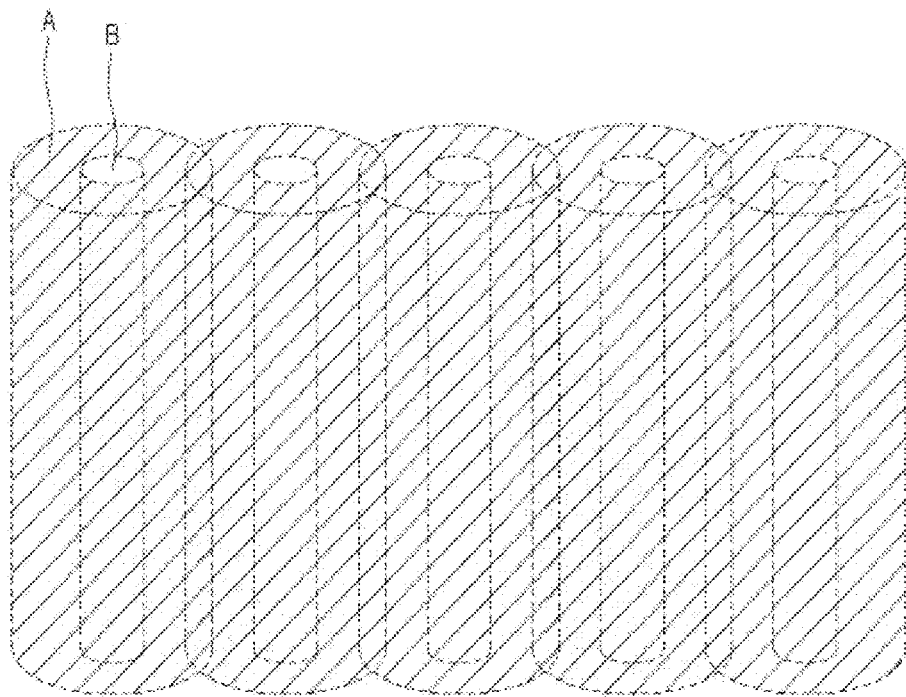

Meanwhile, since the via hole 200 has a large area, the via 190 may be configured as follows:

Referring to FIG. 16, when the plating is performed in the via hole 200, an A portion shown in FIG. 16 is plated. In other words, when the plating is performed in the via hole 200, the plating may be performed from an edge area of each via hole.

If the plating is performed in the via hole 200 having the above shape, a contact portion between the via holes may be narrowed (protruded) as compared with other portions, so more electrons may be concentrated on the contact portion as compared with other portions, so that the plating growth rate may be increased as compared with other portions.

Figure 17:
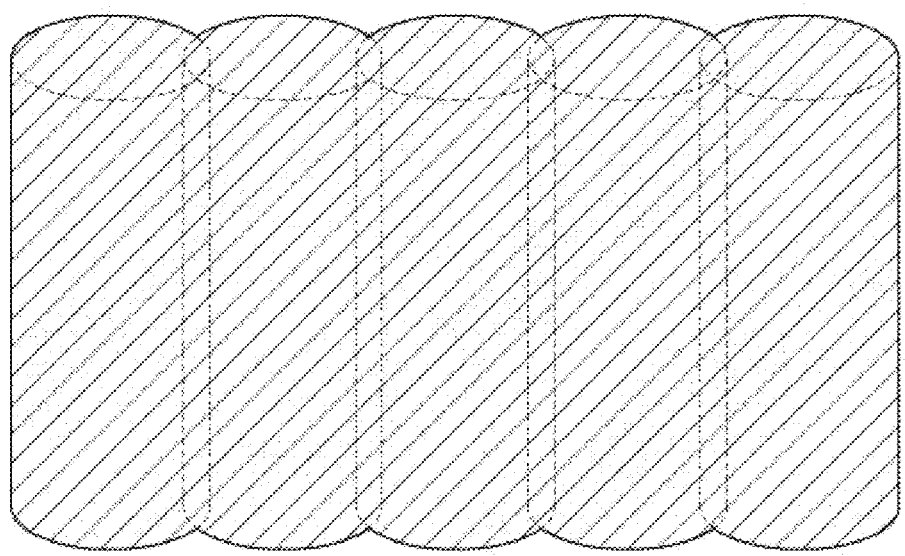

In addition, as shown in FIG. 17, if the plating is continued, the metallic material may be filled in a B portion as well as the A portion of FIG. 16, so that the via 190 may be finally formed.

Figure 18:
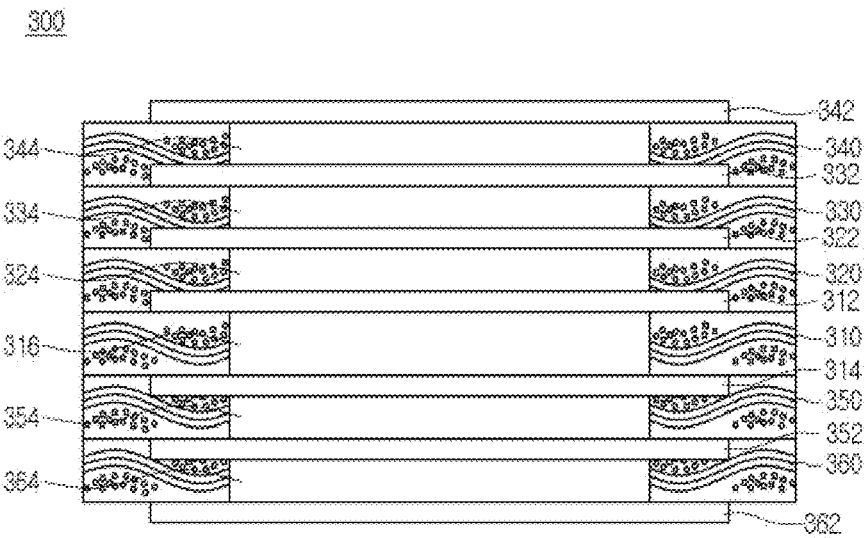
FIG. 18 is a sectional view showing a PCB according to a second embodiment.

FIG. 18 is a sectional view showing a PCB according to a second embodiment.

Referring to FIG. 18, the PCB 300 may include a first insulating layer 310, a second insulating layer 320, a third insulating layer 330, a fourth insulating layer 340, a fifth insulating layer 360, a sixth insulating layer 370, a first pad 312, a second pad 314, a third pad 322, a fourth pad 332, a fifth pad 342, a sixth pad 352, a seventh pad 362, a first via 316, a second via 324, a third via 334, a fourth via 344, a fifth via 354, and a sixth via 364.

The PCB 300 shown in FIG. 18 is identical to the PCB 100 shown in FIG. 5 except for the pad and via parts, so the following description will be focused on the different parts.

The via according to the second embodiment may be formed in each insulating layer.

That is, different from the first embodiment in which the via is formed at a time after all insulating layers have been laminated, the second embodiment may form the via with respect to each insulating layer.

Thus, although only one via is formed in the first embodiment, the via may be formed for each insulating layer in the second embodiment and the number of vias may correspond to the number of insulating layers.

The shape of the first to sixth vias 316 to 364 may be identical to the shape of the via 190 formed in the PCB according to the first embodiment, so detailed description thereof will be omitted.

Figure 19:
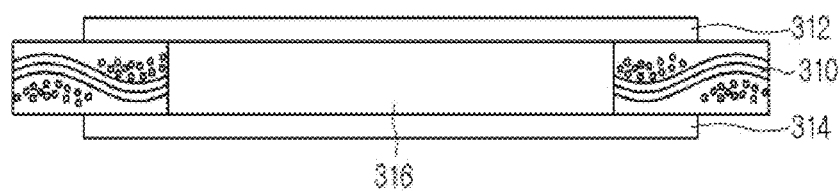
FIGS. 19 to 21 are sectional views sequentially showing a method of manufacturing a PCB according to a second embodiment.
Figure 20:
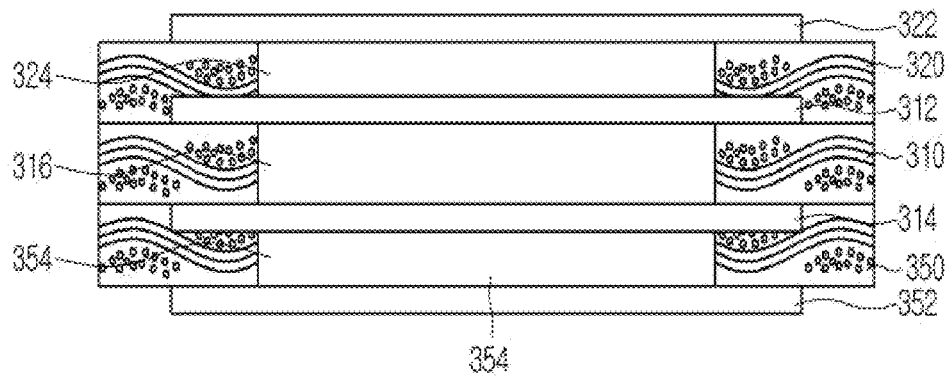
Figure 21:
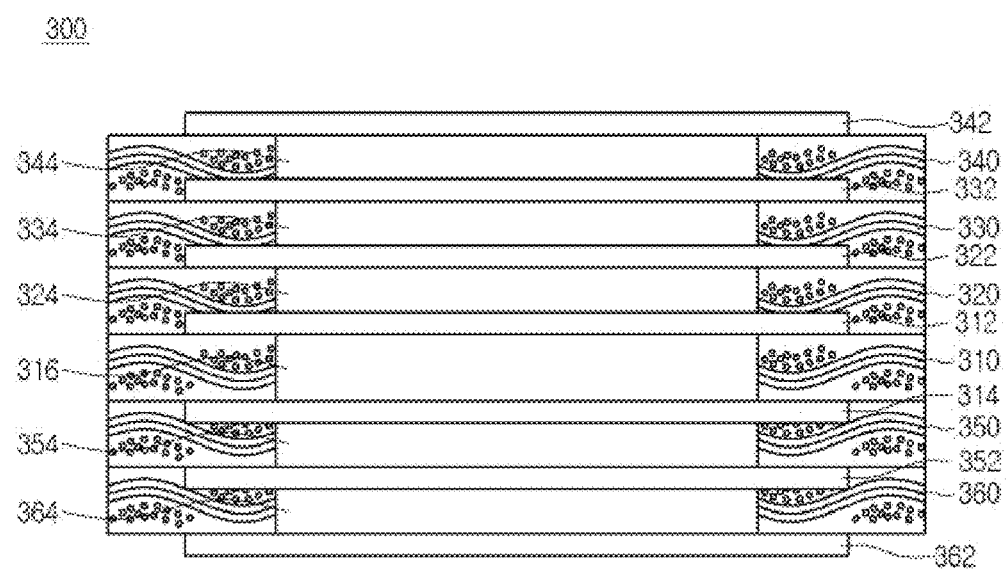

FIGS. 19 to 21 are sectional views sequentially showing a method of manufacturing a PCB according to a second embodiment.

Referring to FIG. 19, the first insulating layer 310 is prepared and the first via 316, the first pad 312 and the second pad 314 are formed in the first insulating layer 310.

The method of forming the first via 316, the first pad 312 and the second pad 314 may be identical to the method of forming the via 190, the first pad 170 and the second pad 180 according to the second embodiment, so detailed description thereof will be omitted.

Then, referring to FIG. 20, the second insulating layer 320 is formed on the first insulating layer 310 and the fifth insulating layer 350 is formed under the first insulating layer 310.

In addition, the third pad 322, the sixth pad 352, the second via 324 and the fifth via 354 are formed with respect to the second insulating layer 320 and the fifth insulating layer 350.

Then, referring to FIG. 21, the third insulating layer 330, the fourth insulating layer 340, the sixth insulating layer 360, the fourth pad 332, the fifth pad 352, the seventh pad 362, the third via 334, the fourth via 344 and the sixth via 364 are formed, respectively.

In addition, although it has been described that the via includes the first to sixth vias 316 to 364, this is illustrative purpose only. The via may include upper vias, which are formed over the base insulating layer, and lower vias which are formed under the base insulating layer.

The via will be described later in more detail.

According to the embodiment, the via hole having a novel shape can be developed and the PCB having the via can be manufactured, so that the lead time can be reduced and the process cost can be saved.

In addition, according to the embodiment, the vias can be simultaneously formed in a plurality of layers, so the alignment of the vias formed in the layers can be improved.

Further, according to the embodiment, the dimple phenomenon can be diminished by the via having the novel shape, so the reliability of the PCB can be improved.

Figure 22:
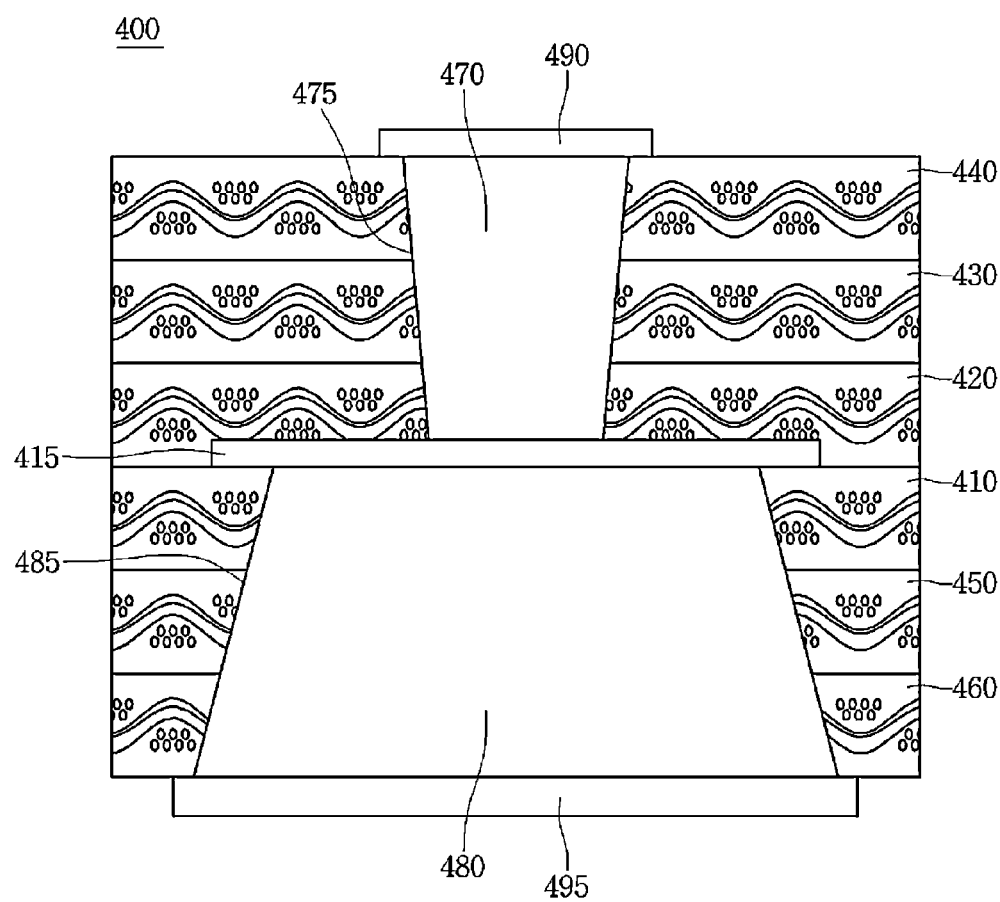
FIG. 22 is a sectional view showing a PCB according to a third embodiment.

FIG. 22 is a sectional view showing a PCB according to a third embodiment.

Referring to FIG. 22, the PCB 100 may include a first insulating layer 410, a second insulating layer 420, a third insulating layer 430, a fourth insulating layer 440, a fifth insulating layer 450, a sixth insulating layer 460, a base pad 415, a first via 470, a second via 480, a first outer layer pad 490, and a second outer layer pad 495. The first outer layer pad 490 may be a first pad and the second outer layer pad 495 may be a second pad.

In addition, the first insulating layer 410, the second insulating layer 420, the third insulating layer 430, the fourth insulating layer 440, the fifth insulating layer 450, and the sixth insulating layer 460 may be classified as a base insulating layer, an upper insulating layer and a lower insulating layer based on the first pad, which will be described later in more detail.

The first insulating layer 410, the second insulating layer 420, the third insulating layer 430, the fourth insulating layer 440, the fifth insulating layer 450, and the sixth insulating layer 460 may constitute an insulating plate and may include a thermosetting or thermoplastic polymeric substrate, a ceramic substrate, an organic-inorganic composite substrate, or a glass fiber impregnated substrate. If the insulating layers include the polymeric resin, the insulating layers may include epoxy insulating resin, such as FR-4, Bismaleimide Triazine (BT), or Ajinomoto Build up Film (ABF). Alternatively, the insulating layers may include polyimide based resin, but the embodiment is not limited thereto.

The first insulating layer 410, the second insulating layer 420, the third insulating layer 430, the fourth insulating layer 440, the fifth insulating layer 450 and the sixth insulating layer 460 may include the same material, and preferably, may include an insulating sheet formed of only resin.

The first insulating layer 410 may be a base insulating layer. The base insulating layer may refer to an insulating layer which is primarily formed in the stack structure including the first insulating layer 410, the second insulating layer 420, the third insulating layer 430, the fourth insulating layer 440, the fifth insulating layer 450, and the sixth insulating layer 460.

A base pad 415 may be formed on one surface of the first insulating layer 410.

The base pad 415 may be formed through typical processes of fabricating the printed circuit board, such as an additive process, a subtractive process, a modified semi-additive process (MSAP), and a semi-additive process, and the details thereof will be omitted.

The base pad 415 may be formed of a metal including copper.

The second insulating layer 420, the third insulating layer 430, and the fourth insulating layer 440 may be sequentially laminated on the first insulating layer 410.

The fifth insulating layer 450 and the sixth insulating layer 460 may be sequentially laminated under the first insulating layer 410.

In addition, a first via hole 475 may be formed in the insulating layers formed above the base pad 415 and a second via hole 485 may be formed in the insulating layers formed under the base pad 415.

The first via hole 475 is formed in the second insulating layer 420, the third insulating layer 430, and the fourth insulating layer 440.

The first via hole 475 may be formed by simultaneously opening the second insulating layer 420, the third insulating layer 430, and the fourth insulating layer 440.

That is, the first insulating layer 410 may be a base insulating layer and the second insulating layer 420, the third insulating layer 430, and the fourth insulating layer 440 may be the upper insulating layer.

Thus, the width of the first via hole 475 formed in the second insulating layer 420, the third insulating layer 430, and the fourth insulating layer 440 may correspond to the width of the via hole of the upper insulating layer and the width of the via hole of the lower insulating layer.

In other words, an upper width of the via hole formed in the second insulating layer 420 is identical to a lower width of the via hole formed in the third insulating layer 430.

Further, an upper width of the via hole formed in the third insulating layer 430 is identical to a lower width of the via hole formed in the fourth insulating layer 430.

Further, the first via 470 is formed in the second insulating layer 420, the third insulating layer 430, and the fourth insulating layer 440. That is, the first via hole 475 is filled with a metallic material so that the first via 470 is formed.

The first via 470 may be formed in the second insulating layer 420, the third insulating layer 430, and the fourth insulating layer 440 at a time.

That is, the first via 470 may be formed through the second insulating layer 420, the third insulating layer 430, and the fourth insulating layer 440, so the vias formed in the second insulating layer 420, the third insulating layer 430, and the fourth insulating layer 440 may be integrated.

In addition, a bottom surface of the first via 470 formed in the second insulating layer 420 directly makes contact with a top surface of the base pad 415, and a top surface of the first via 470 formed in the second insulating layer 420 directly makes contact with a bottom surface of the first via 470 formed in the third insulating layer 430.

In addition, an upper width of the first via 470 formed in the second insulating layer 420 is equal to a lower width of the first via 470 formed in the third insulating layer 430.

A top surface of the first via 470 formed in the third insulating layer 430 directly makes contact with a bottom surface of the first via 470 formed in the fourth insulating layer 440.

In addition, an upper width of the first via 470 formed in the third insulating layer 430 is equal to a lower width of the first via 470 formed in the fourth insulating layer 440.

Further, the first outer layer pad 490 making contact with the top surface of the first via 470 is formed on a top surface of the fourth insulating layer 440.

That is, there is no pad except for the base pad 415 in the stack structure including a plurality of insulating layers according to the embodiment. In addition, the outer layer pad described above may be formed on an exposed surface of the outermost insulating layer.

The second via hole 485 is formed in the first insulating layer 410, the fifth insulating layer 450, and the sixth insulating layer 460.

That is, the first insulating layer 410, the fifth insulating layer 450, and the sixth insulating layer 460 may be disposed under the base pad 415 and the second via hole 485 may be formed in the first insulating layer 410, the fifth insulating layer 450, and the sixth insulating layer 460.

The second via hole 485 may be formed by simultaneously opening the first insulating layer 410, the fifth insulating layer 450, and the sixth insulating layer 460.

Thus, the width of the second via hole 485 formed in the first insulating layer 410, the fifth insulating layer 450, and the sixth insulating layer 460 may correspond to the width of the via hole of the upper insulating layer and the width of the via hole of the lower insulating layer.

In other words, a lower width of the via hole formed in the first insulating layer 410 is identical to an upper width of the via hole formed in the fifth insulating layer 450.

Further, a lower width of the via hole formed in the fifth insulating layer 450 is identical to an upper width of the via hole formed in the sixth insulating layer 460.

In addition, the second via 480 is formed in the first insulating layer 410, the fifth insulating layer 450, and the sixth insulating layer 460. That is, the second via hole 485 is filled with a metallic material so that the second via 480 is formed.

The second via 480 may be formed in the first insulating layer 410, the fifth insulating layer 450, and the sixth insulating layer 460 at a time.

That is, the second via 480 may be formed through the first insulating layer 410, the fifth insulating layer 450, and the sixth insulating layer 460, so the vias formed in the first insulating layer 410, the fifth insulating layer 450, and the sixth insulating layer 460 may be integrated.

In addition, a top surface of the second via 480 formed in the first insulating layer 410 directly makes contact with a bottom surface of the base pad 415, and a top surface of the second via 480 formed in the fifth insulating layer 450 directly makes contact with a bottom surface of the second via 480 formed in the first insulating layer 410.

In addition, an upper width of the second via 480 formed in the fifth insulating layer 450 is equal to a lower width of the second via 480 formed in the first insulating layer 410.

A top surface of the second via 480 formed in the sixth insulating layer 460 directly makes contact with a bottom surface of the second via 480 formed in the fifth insulating layer 450.

In addition, an upper width of the second via 480 formed in the sixth insulating layer 460 is equal to a lower width of the second via 480 formed in the fifth insulating layer 450.

Further, the second outer layer pad 495 making contact with the bottom surface of the second via 480 is formed on a bottom surface of the sixth insulating layer 460.

Meanwhile, the width of the first via 470 may be gradually increased from one surface, which makes contact with the base pad 415, to the other surface thereof. That is, the first via 470 may have a trapezoidal shape having an upper width larger than a lower width.

The width of the second via 480 may be gradually increased from one surface, which makes contact with the base pad 415, to the other surface thereof. That is, the second via 480 may have a trapezoidal shape having a lower width larger than an upper width.

In view of the overall structure, the second via 480 may have a width wider than a width of the first via 470.

The first and second vias 170 and 180 may include any one selected from Cu, Ag, Sn, Au, Ni and Pd and may be formed through any one of an electroless plating scheme, an electrolytic plating scheme, a screen printing scheme, a sputtering scheme, an evaporation scheme, an ink-jet scheme, and a dispensing scheme or the combination thereof.

Meanwhile, the insulating layers formed above the base pad 415 may be the upper insulating layers and the insulating layers formed under the base pad 415 may be the lower insulating layers.

Since the base pad 415 is formed on the first insulating layer 410 serving as the base insulating layer, the first insulating layer 410 may be included in the lower insulating layers.

At this time, the first outer layer pad 490 is formed on the uppermost insulating layer (that is, the fourth insulating layer) of at least one upper insulating layer, the second outer layer pad 495 is formed on the lowermost insulating layer (that is, the sixth insulating layer) of at least one lower insulating layer, and the first and second vias 470 and 480, which are upper and lower vias, are distinguished based on the position of the base pad 415.

In addition, there is no pad connected to the first via and the second via on the base insulating layer, the upper insulating layer and the lower insulating layer, except for the first outer layer pad, the second outer layer pad and the base pad.

In addition, although not described above, the first and second vias 170 and 180 may have the shape the same as the shape of the via 190 shown in FIG. 5.

That is, the first via 470 may have a column shape the same as the via 190 shown in FIG. 5, so the first via 470 may include a plurality of via parts which are partially overlapped with each other.

Similar to the first via 470, the second via 480 may include a plurality of via parts which are partially overlapped with each other.

According to the embodiment, additional pads except for the base pad may not be necessary, so the degree of freedom can be increased when designing the PCB.

Further, according to the embodiment, the via holes can be formed by opening a plurality of layers at a time, and the vias can be formed by filling the via holes, so the lead time can be reduced and the process cost can be saved.

In addition, according to the embodiment, since the vias can be simultaneously formed in a plurality of layers, the alignment of the vias formed in the layers can be improved.

FIGS. 23 to 27 are sectional views sequentially showing a method of manufacturing a PCB shown in FIG. 22 according to a third embodiment.

Figure 23:
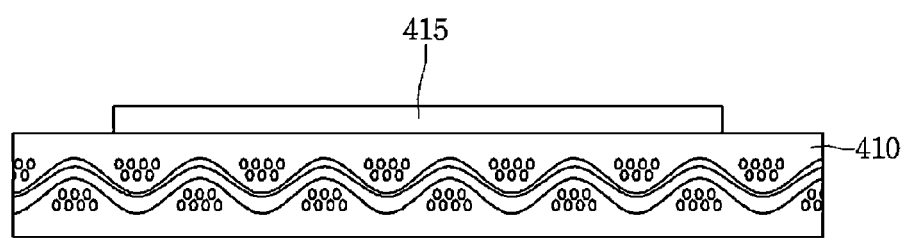
FIGS. 23 to 27 are sectional views sequentially showing a method of manufacturing a PCB shown in FIG. 22 according to a third embodiment.

Referring to FIG. 23, the first insulating layer 410, which is a core element of the PCB, is prepared and the base pad 415 is formed on the top surface of the first insulating layer 410.

Figure 24:
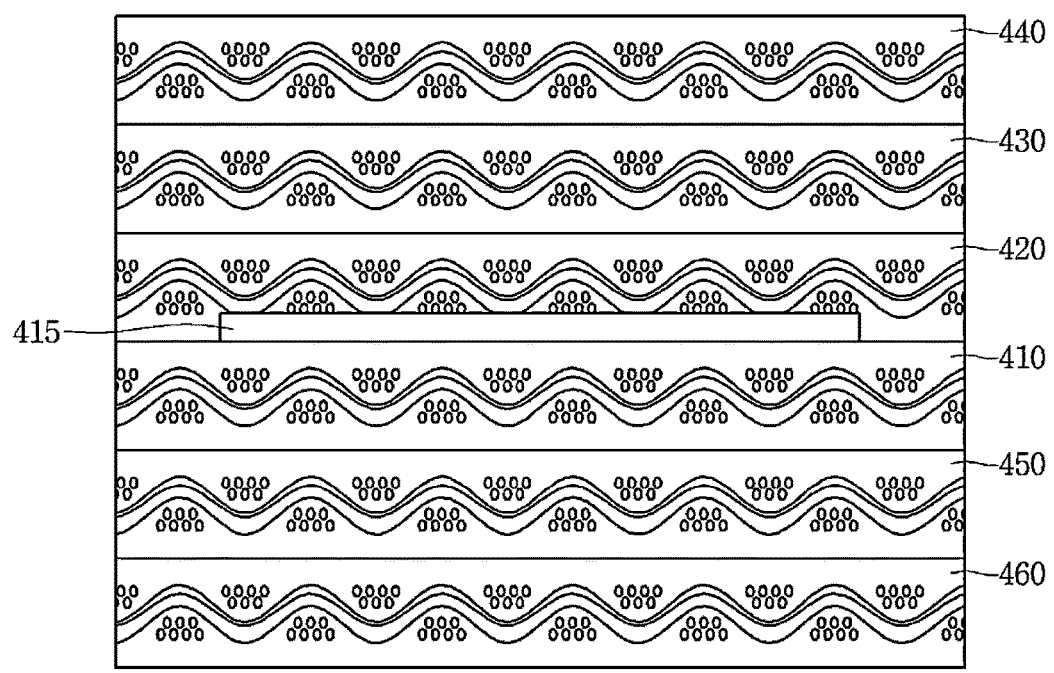

Then, referring to FIG. 24, a plurality of insulating layers (upper insulating layers) are sequentially formed on the top surface of the first insulating layer 410 and a plurality of insulating layers (lower insulating layers) are sequentially formed on the bottom surface of the first insulating layer 410.

In other words, when the base pad 415 is formed, the second insulating layer 420 is laminated on the first insulating layer 410. In addition, as the second insulating layer 420 is laminated, the third insulating layer 430 is laminated on the second insulating layer 420. Further, as the third insulating layer 430 is laminated, the fourth insulating layer 440 is laminated on the third insulating layer 430.

In addition, the fifth insulating layer 450 is laminated under the first insulating layer 410. Further, as the fifth insulating layer 450 is laminated, the sixth insulating layer 460 is laminated under the fifth insulating layer 450.

Figure 25:
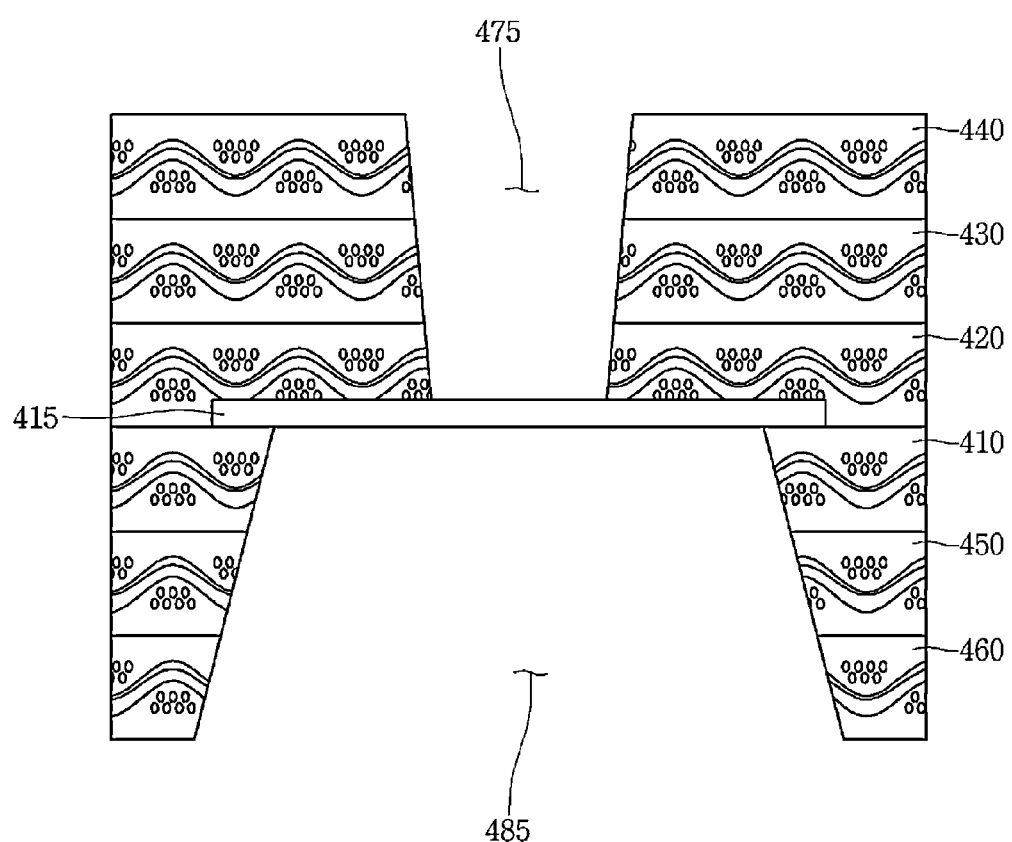

Then, referring to FIG. 25, the insulating layers formed over the base pad 415 are simultaneously open to form the first via hole 475.

That is, the second insulating layer 420, the third insulating layer 430 and the fourth insulating layer 440 formed over the base pad 415 are simultaneously open to expose the top surface of the base pad 415.

The first via hole 475 can be formed through at least one of mechanical, laser and chemical processes.

If the first via hole 475 is formed through the mechanical process, a milling scheme, a drill scheme, or a routing scheme may be used. If the first via hole 475 is formed through the laser process, a UV laser scheme or a CO2 laser scheme may be used. If the first via hole 475 is formed through the chemical process, the second insulating layer 420, the third insulating layer 430 and the fourth insulating layer 440 may be simultaneously open by using chemicals such as aminosilane or ketones.

Meanwhile, according to the laser process, optical energy is concentrated on a surface of a material, so that a portion of the material can be cut in a desirable form by melting and evaporating the portion of the material, and a complex shape can be easily processed through a computer program.

In addition, according to the laser process, a material can be cut into a diameter of 0.005 mm and the thickness range for the processing may be wide.

A $CO_2$ laser is preferably used as a laser processing drill. The $CO_2$ laser can process only the insulating layers and the base pad 415 may serve as a stopper, so the second insulating layer 420, the third insulating layer 430 and the fourth insulating layers 440 can be simultaneously open, so that the top surface of the base pad 415 can be exposed to the outside.

Then, the second via hole 485 is formed by simultaneously opening the insulating layers formed under the base pad 415.

That is, the first insulating layer 410, the fifth insulating layer 450 and the sixth insulating layer 460 formed under the base pad 415 are simultaneously open to expose the bottom surface of the base pad 415.

The second via hole 485 can be formed through at least one of mechanical, laser and chemical processes.

If the second via hole 485 is formed through the mechanical process, a milling scheme, a drill scheme, or a routing scheme may be used. If the second via hole 485 is formed through the laser process, a UV laser scheme or a $CO_2$ laser scheme may be used. If the second via hole 485 is formed through the chemical process, the first insulating layer 410, the fifth insulating layer 450 and the sixth insulating layer 460 may be simultaneously open by using chemicals such as aminosilane or ketones.

Figure 26:
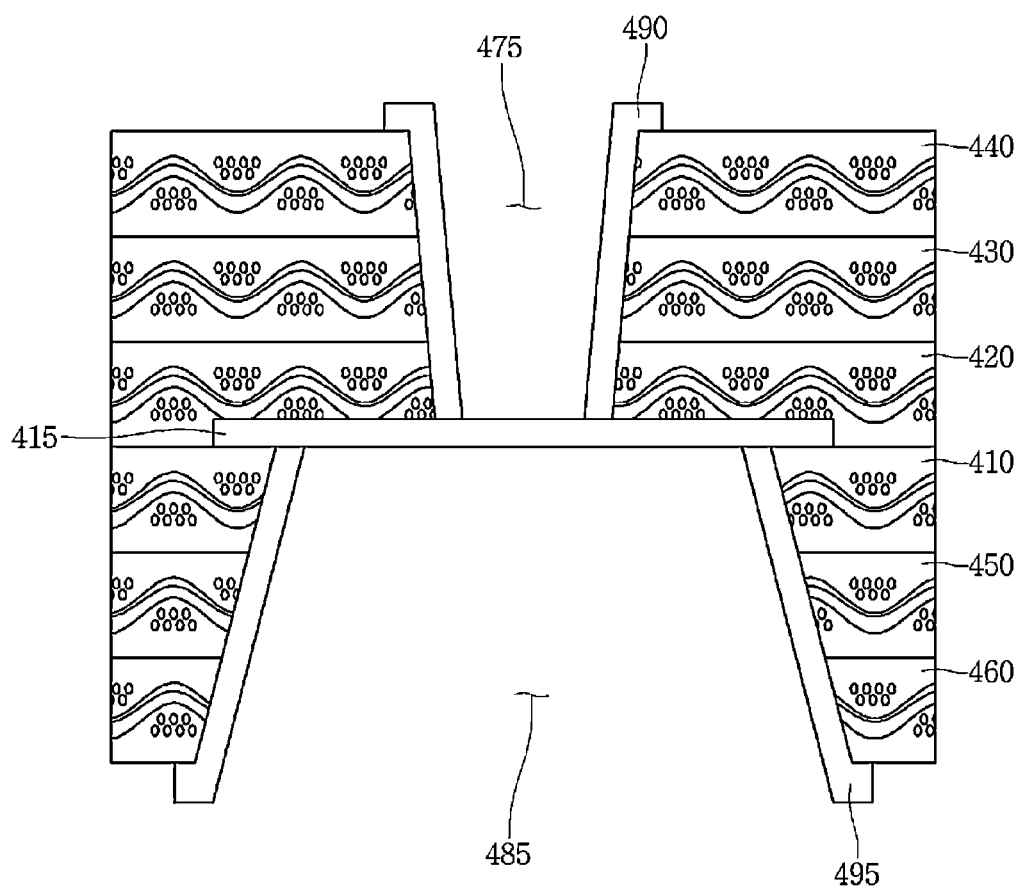

Then, referring to FIG. 26, as the first and second via holes 475 and 485 have been formed, external circuit patterns (not shown) are formed on the top surface of the fourth insulating layer 440 and the bottom surface of the sixth insulating layer 460. At this time, the first outer layer pad 490 is formed on the top surface of the fourth insulating layer 440 to expose the first via hole 475 and the second outer layer pad 495 is formed on the bottom surface of the sixth insulating layer 460 to expose the second via hole 485.

Figure 27:
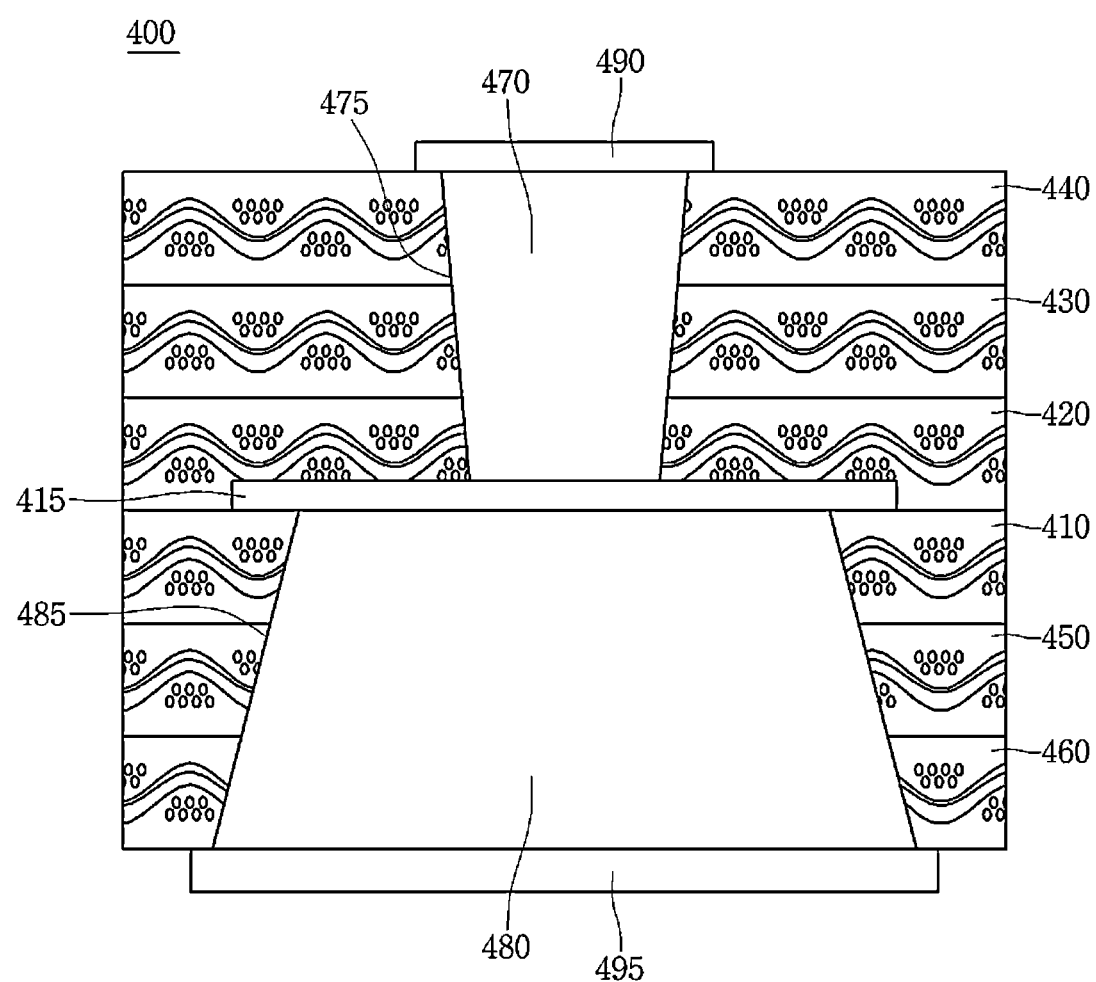

After that, as shown in FIG. 27, a metallic paste is filled in the first via hole 475 to form the first via 470 filled in the first via hole 475.

The first via 470 is formed through the second insulating layer 420, the third insulating layer 430 and the fourth insulating layer 440. The first via 470, which is formed through the second insulating layer 420, the third insulating layer 430 and the fourth insulating layer 440, may be integrated.

In addition, a metallic paste is filled in the second via hole 485 to form the second via 480 filled in the second via hole 485.

The second via 480 is formed through the first insulating layer 410, the fifth insulating layer 450 and the sixth insulating layer 460. The second via 480, which is formed through the first insulating layer 410, the fifth insulating layer 450 and the sixth insulating layer 460, may be integrated.

Figure 28:
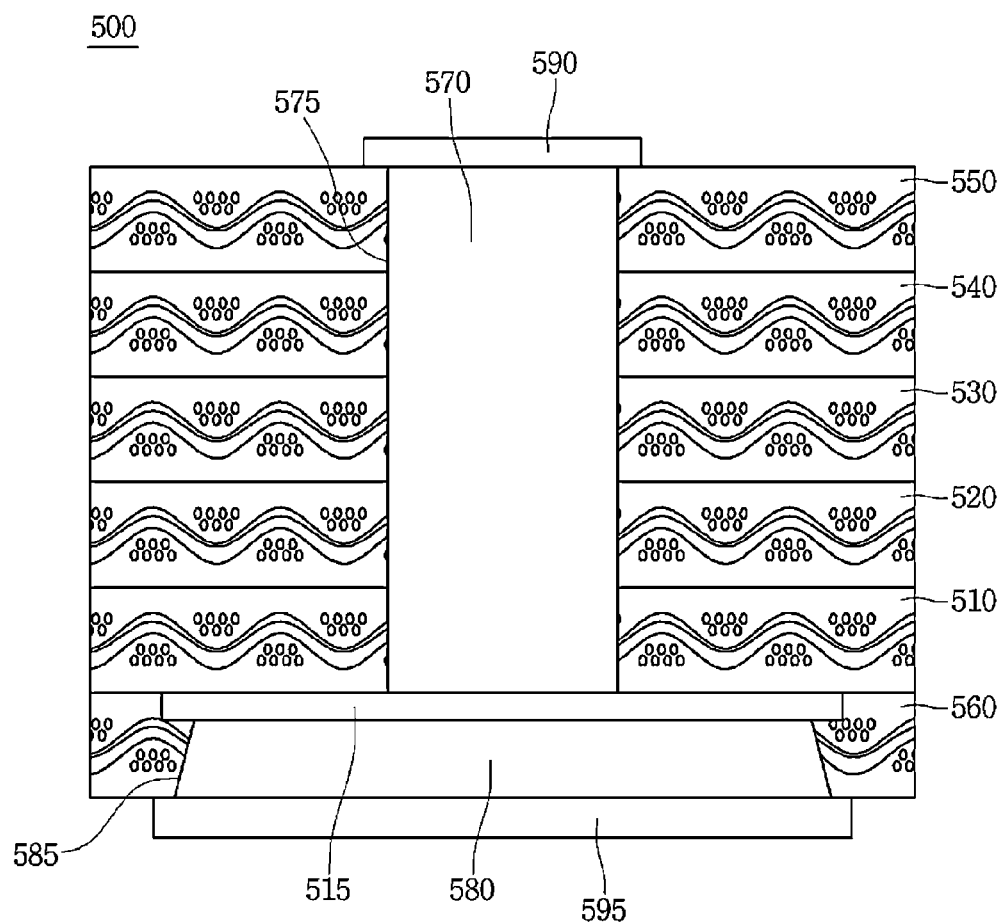
FIG. 28 is a sectional view showing a PCB according to a fourth embodiment.

FIG. 28 is a sectional view showing a PCB according to a fourth embodiment.

Referring to FIG. 28, the PCB 500 may include a first insulating layer 510, a second insulating layer 520, a third insulating layer 530, a fourth insulating layer 540, a fifth insulating layer 550, a sixth insulating layer 560, a base pad 515, a first via 570, a second via 580, a first outer layer pad 590 and a second outer layer pad 595.

The PCB according to the fourth embodiment is generally identical to the PCB according to the third embodiment except for the position of the base pad 515.

In addition, the shape of the first and second vias 570 and 580 may be different from the shape of the first and second vias 470 and 480 formed in the PCB of the third embodiment depending on the position of the base pad 515 of the PCB according to the fourth embodiment.

That is, the base pad 515 is formed at the bottom surface of the first insulating layer 510 of the PCB 500.

In addition, the second insulating layer 520, the third insulating layer 530, the fourth insulating layer 540, and the fifth insulating layer 550 are sequentially laminated on the first insulating layer 510.

In addition, only the sixth insulating layer 560 is formed under the first insulating layer 510.

Thus, the first via 570 may be formed through the first insulating layer 510, the second insulating layer 520, the third insulating layer 530, the fourth insulating layer 540, and the fifth insulating layer 550.

In addition, the second via 580 is formed only on the sixth insulating layer 560.

Figure 29:
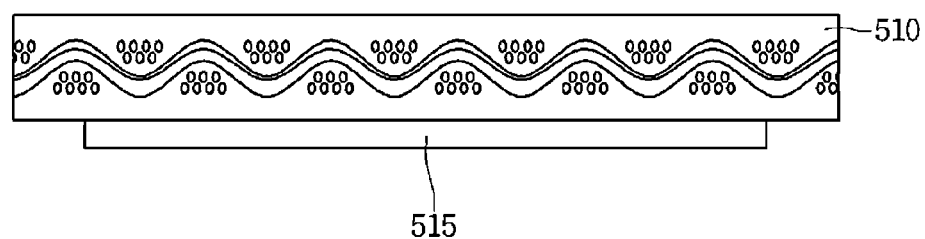
FIGS. 29 to 31 are sectional views sequentially showing a method of manufacturing a PCB shown in FIG. 28 according to a fourth embodiment.
Figure 30:
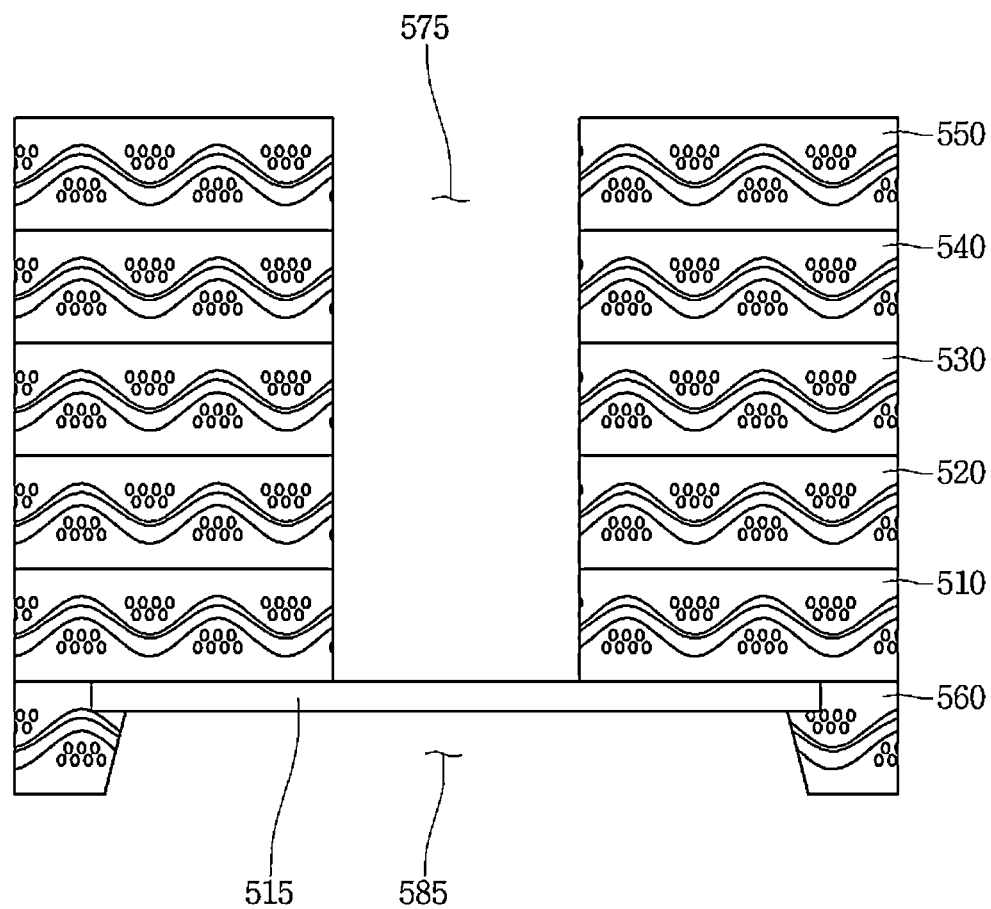
Figure 31:
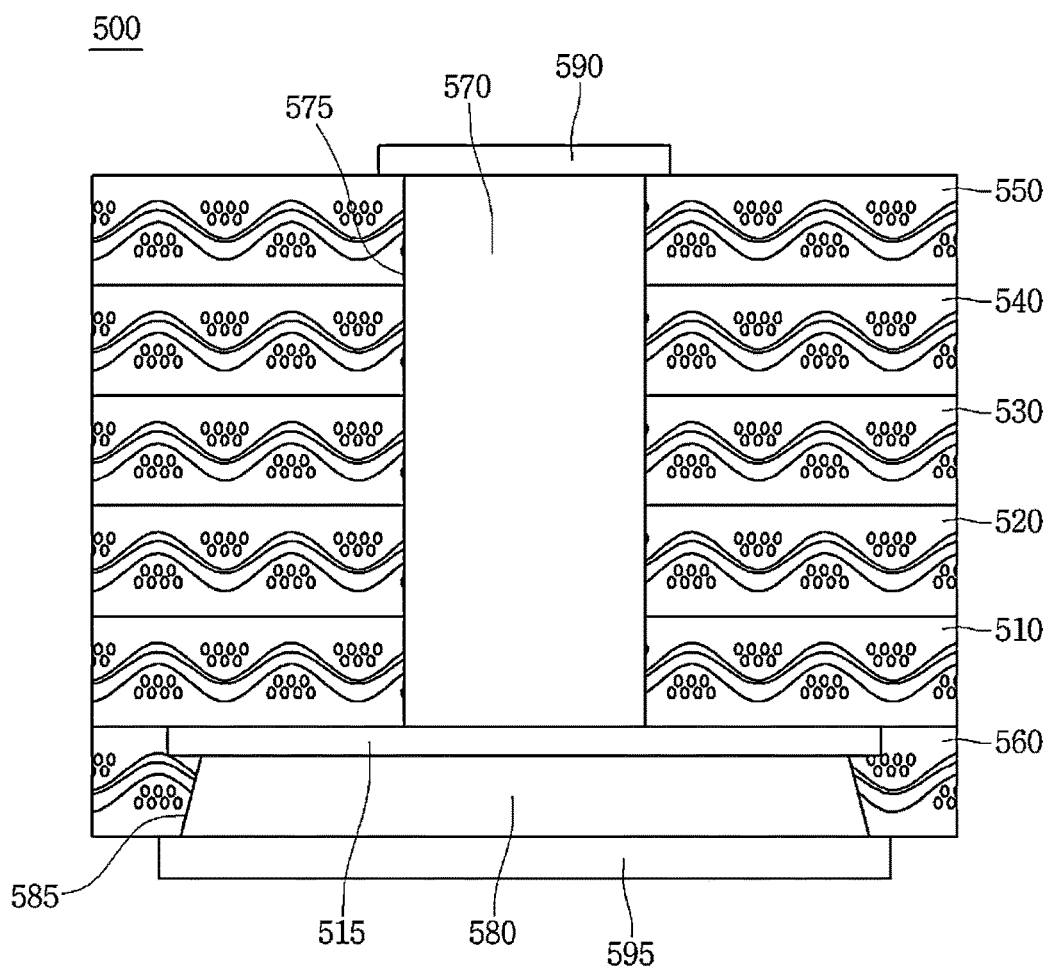

FIGS. 29 to 31 are sectional views sequentially showing a method of manufacturing a PCB shown in FIG. 28 according to a fourth embodiment.

Referring to FIG. 29, the first insulating layer 510, which is a core element of the PCB, is prepared and the base pad 515 is formed on the bottom surface of the first insulating layer 510.

Then, referring to FIG. 30, a plurality of insulating layers are sequentially formed on the top surface of the first insulating layer 510 and one insulating layer is formed on the bottom surface of the first insulating layer 510.

In other words, when the base pad 515 is formed, the second insulating layer 520 is laminated on the first insulating layer 510. In addition, as the second insulating layer 520 is laminated, the third insulating layer 530 is laminated on the second insulating layer 520. Further, as the third insulating layer 530 is laminated, the fourth insulating layer 540 is laminated on the third insulating layer 530. In addition, as the fourth insulating layer 540 is laminated, the fifth insulating layer 550 is laminated on the fourth insulating layer 540.

In addition, the sixth insulating layer 560 is laminated under the first insulating layer 510.

Then, the insulating layers formed over the base pad 515 are simultaneously open to form the first via hole 575.

That is, the first insulating layer 510, the second insulating layer 520, the third insulating layer 530, the fourth insulating layer 540 and the fifth insulating layer 550, which are upper insulating layers formed over the base pad 515, are simultaneously open to expose the top surface of the base pad 515.

In addition, the sixth insulating layer 560 formed under the base pad 515 is open to form the second via hole 585 which exposes the bottom surface of the base pad 515.

Then, referring to FIG. 31, as the first and second via holes 575 and 585 have been formed, the metallic paste is filled in the first via hole 575 to form the first via 570 filled in the first via hole 575. At this time, the first outer layer pad 590, which expands to the surface of the fifth insulating layer 550, is formed at the upper end of the first via 570.

In addition, the metallic paste is filled in the second via hole 585 to form the second via 580 filled in the second via hole 585.

Figure 32:
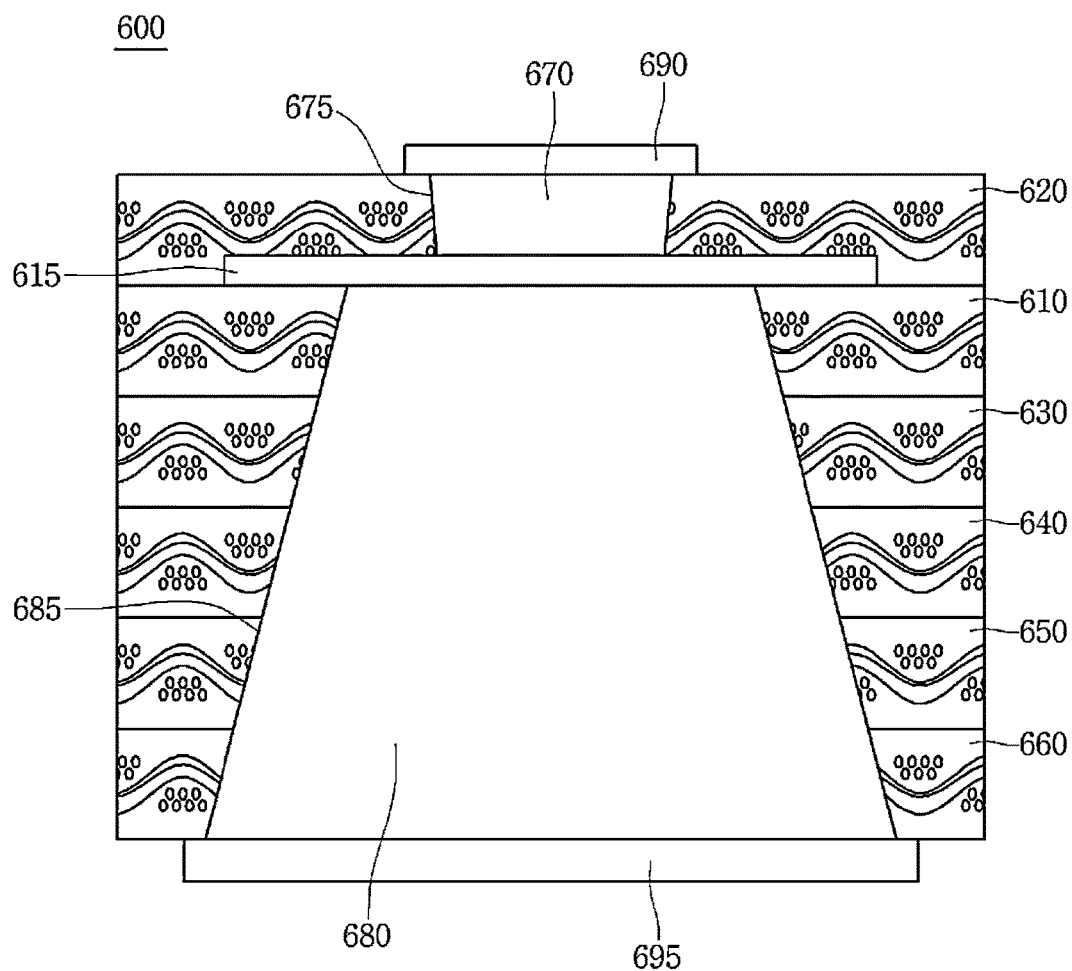
FIG. 32 is a sectional view showing a PCB according to a fifth embodiment.

FIG. 32 is a sectional view showing a PCB according to a fifth embodiment.

Referring to FIG. 32, the PCB 600 may include a first insulating layer 610, a second insulating layer 620, a third insulating layer 630, a fourth insulating layer 640, a fifth insulating layer 650, a sixth insulating layer 660, a base pad 515, a first via 670, a second via 680, a first outer layer pad 690 and a second outer layer pad 695.

The PCB according to the fifth embodiment is generally identical to the PCBs according to the third and fourth embodiments except for the position of the base pad 615.

In addition, the shape of the first and second vias 670 and 680 may be different from the shape of the first and second vias formed in the PCB of the third and fourth embodiments depending on the position of the base pad 615 of the PCB according to the fifth embodiment.

That is, the base pad 615 is formed on the top surface of the first insulating layer 610 of the PCB 600.

In addition, only the second insulating layer 620 is laminated on the first insulating layer 610.

In addition, the third insulating layer 630, the fourth insulating layer 640, the fifth insulating layer 650, and the sixth insulating layer 660 are formed under the first insulating layer 610.

Thus, the first via 670 is exclusively formed in the second insulating layer 620 and the second via 680 is formed through the first insulating layer 610, the third insulating layer 630, the fourth insulating layer 640, the fifth insulating layer 650, and the sixth insulating layer 660.

Figure 33:
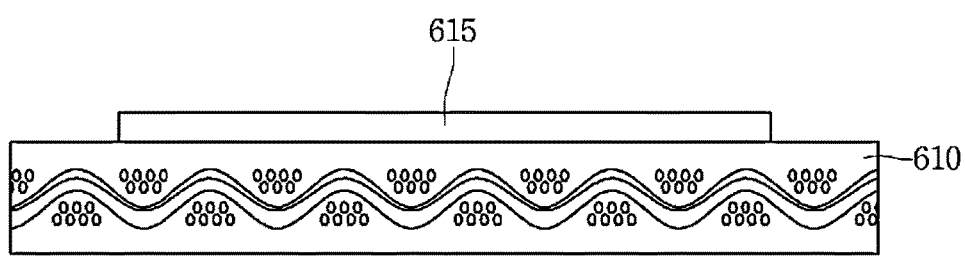
FIGS. 33 to 35 are sectional views sequentially showing a method of manufacturing a PCB shown in FIG. 32 according to a fifth embodiment.
Figure 34:
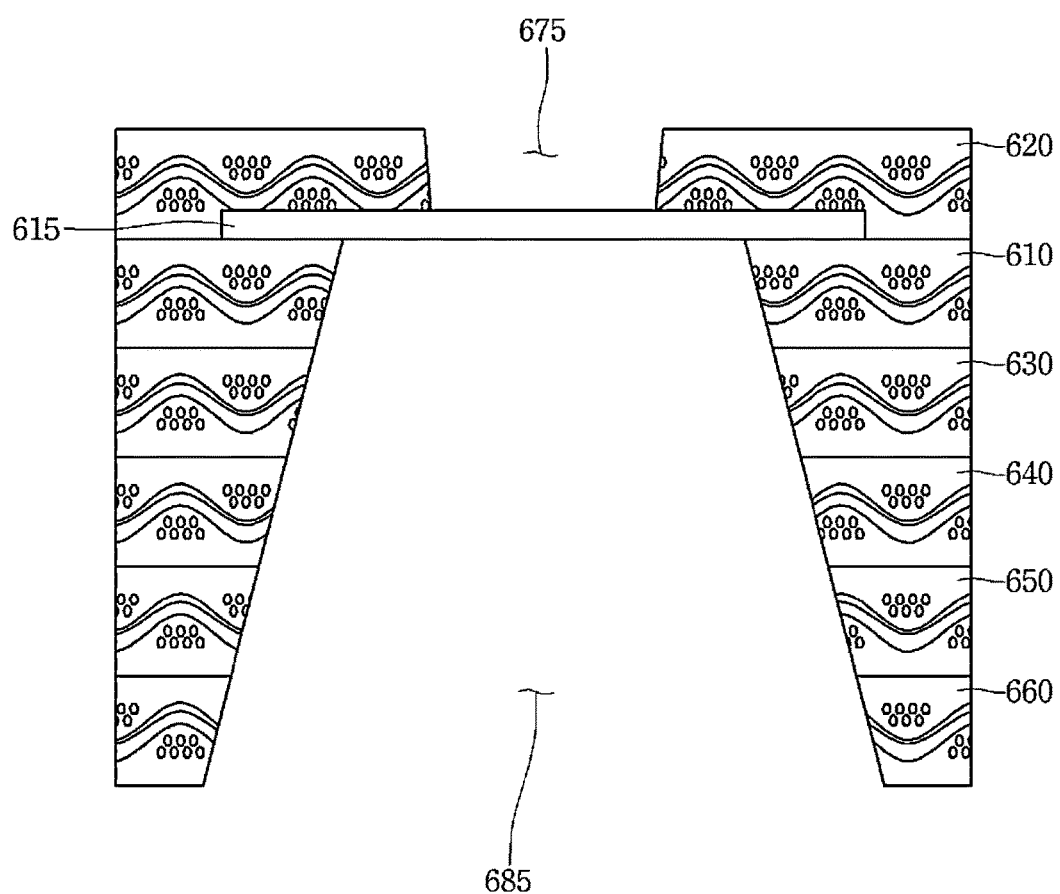
Figure 35:
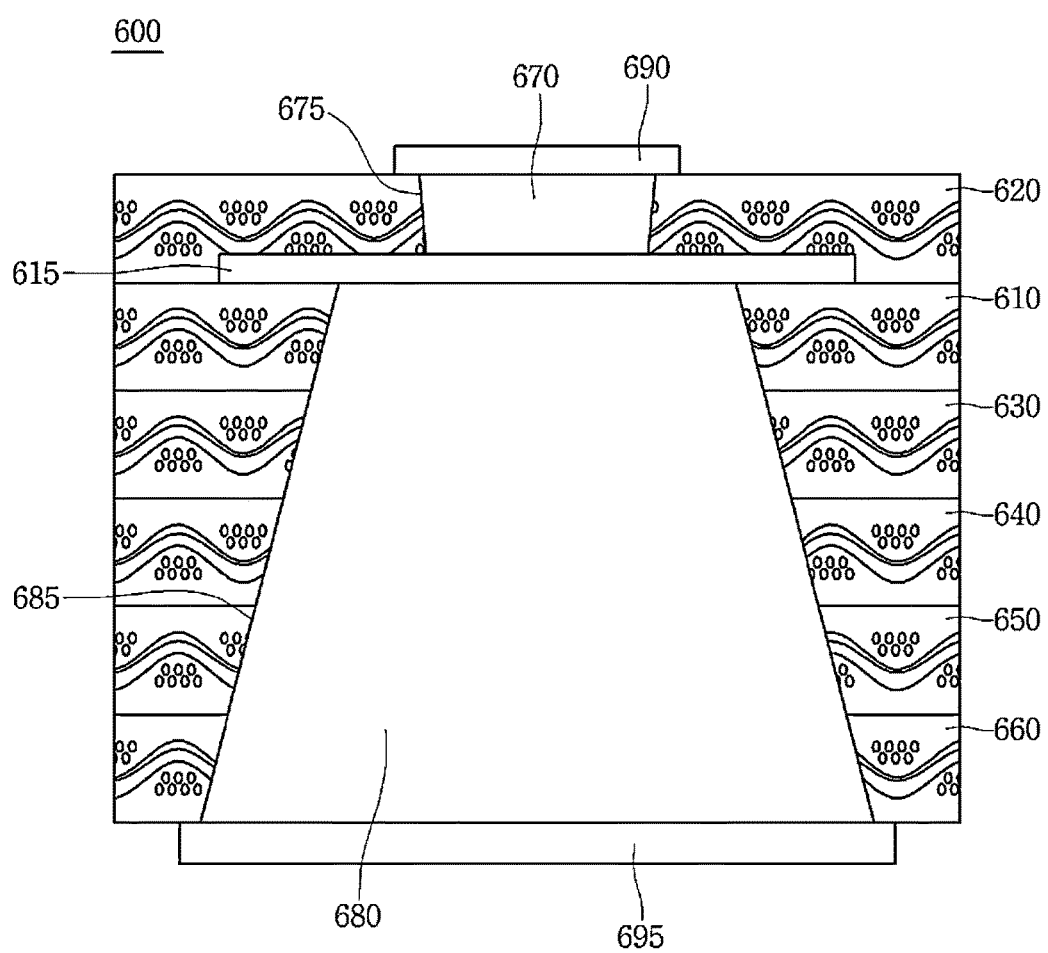

FIGS. 33 to 35 are sectional views sequentially showing a method of manufacturing a PCB shown in FIG. 32 according to a fifth embodiment.

Referring to FIG. 33, the first insulating layer 610, which is a core element of the PCB, is prepared and the base pad 615 is formed on the top surface of the first insulating layer 610.

Then, referring to FIG. 34, one upper insulating layer is formed on the top surface of the first insulating layer 610 and a plurality of insulating layers are sequentially formed on the bottom surface of the first insulating layer 610.

In other words, when the base pad 615 is formed, the second insulating layer 620 is laminated on the first insulating layer 610.

In addition, the third insulating layer 630 is laminated under the first insulating layer 610. Further, as the third insulating layer 630 is laminated, the fourth insulating layer 640 is laminated under the third insulating layer 630. In addition, as the fourth insulating layer 640 is laminated, the fifth insulating layer 650 is laminated under the fourth insulating layer 640. Further, as the fifth insulating layer 650 is laminated, the sixth insulating layer 660 is laminated under the fifth insulating layer 650.

In addition, the second insulating layer 620 formed over the base pad 515 is open to form the first via hole 675.

Then, the bottom surface of the base pad 615 is exposed by simultaneously opening the first insulating layer 610, the third insulating layer 630, the fourth insulating layer 640, the fifth insulating layer 650, and the sixth insulating layer 660, which are formed under the base pad 615.

After that, referring to FIG. 35, as the first and second via holes 675 and 685 have been formed, the metallic paste is filled in the first via hole 675 to form the first via 670 filled in the first via hole 675. At this time, the first outer layer pad 690, which expands to the surface of the fifth insulating layer 650, is formed at the upper end of the first via 670.

In addition, the metallic paste is filled in the second via hole 685 to form the second via 680 filled in the second via hole 685.

According to the embodiment, additional pads except for a base pad may not be necessary, so the degree of freedom can be increased when designing the PCB.

Further, according to the embodiment, the via holes can be formed by opening a plurality of layers at a time, and the vias can be formed by filling the via holes, so the lead time can be reduced and the process cost can be saved.

In addition, according to the embodiment, since the vias can be simultaneously formed in a plurality of layers, the alignment of the vias formed in the layers can be improved.

The embodiment provides a printed circuit board having a novel structure and a method of manufacturing the same.

In addition, the embodiment provides a via hole having a novel structure, a via, a printed circuit board including the same, and a method of manufacturing the printed circuit board.

Technical objects of the embodiment may not be limited to the above object and other technical objects of the embodiment will be apparent to those skilled in the art from the following description.

A printed circuit board according to the embodiment includes an insulating layer; a first pad on a top surface of the insulating layer; a second pad on a bottom surface of the insulating layer; and a via formed in the insulating layer and having one surface connected to the first pad and an opposite surface connected to the second pad, wherein the via includes a plurality of via parts which are at least partially overlapped with each other.

The insulating layer may include a plurality of insulating layers and the via may be formed through the plurality of insulating layers.

An upper section of the via including the via parts may have a loop shape.

The via may include a first via part formed through the insulating layers; and a second via part adjacent to the first via part and formed through the insulating layers.

Upper sections of the first via part and the second via part may have circular shapes.

At least a portion of the first via part may be overlapped with at least a portion of the second via part.

The insulating layer may include a base insulating layer; at least one upper insulating layer on the base insulating layer; and at least one lower insulating layer under the base insulating layer, wherein a base pad may be formed on at least one of a top surface and a bottom surface of the base insulating layer.

The via may include an upper via formed through the upper insulating layer; and a lower via formed through the lower insulating layer, wherein a top surface of the upper via may directly make contact with the first pad, a bottom surface of the upper via may directly make contact with the base pad, a top surface of the lower via may directly make contact with the base pad, and a bottom surface of the lower via may directly make contact with the second pad.

At least one of the upper insulating layer and the lower insulating layer may include a plurality of layers and the upper via or the lower via may be formed through the plurality of layers.

The first pad may be formed on a top surface of an uppermost insulating layer in the at least one upper insulating layer, the second pad may be formed on a bottom surface of a lowermost insulating layer in the at least one lower insulating layer, the upper via and the lower via may be distinguished based on a position of the base pad, and the base insulating layer, the upper insulating layer and the lower insulating layer may have no pad connected to the upper via and the lower via except for the first pad, the second pad and the base pad.

In addition, a method of manufacturing a printed circuit board according to the embodiment includes: preparing an insulating layer; forming a via hole through a top surface and a bottom surface of the insulating layer; and forming a via by filling the via hole with a metallic material, wherein the via hole includes a plurality of via holes which are at least partially overlapped with each other, and the via includes a plurality of via parts which are filled in the via holes and correspond to the via holes, respectively.

The preparing of the insulating layer may include preparing a plurality of insulating layers having a stack structure, and the via hole may be formed by simultaneously opening the insulating layers.

The forming of the via hole may include forming a first via hole through the top surface and the bottom surface of the insulating layer; and forming a second via hole adjacent to the first via hole, in which the second via hole may be at least partially overlapped with the first via hole.

The first via hole and the second via hole may have circular sectional shapes, respectively.

The method may further include: forming a first pad connected to a top surface of the via on the insulating layer; and forming a second pad connected to a bottom surface of the via under the insulating layer.

The preparing of the insulating layer may include: preparing a base insulating layer having a base pad on at least one surface thereof; laminating an upper insulating layer on the base insulating layer; and laminating a lower insulating layer under the base insulating layer, wherein the via may include an upper via formed through the upper insulating layer and a lower via formed through the lower insulating layer.

The upper insulating layer may include a plurality of upper insulating layers and the upper via may be formed through the plurality of upper insulating layers.

The lower insulating layer may include a plurality of lower insulating layers and the lower via may be formed through the plurality of lower insulating layers.

A top surface of the upper via may directly make contact with the first pad, a bottom surface of the upper via may directly make contact with the base pad, a top surface of the lower via may directly make contact with the base pad, and a bottom surface of the lower via may directly make contact with the second pad.

The first pad may be formed on a top surface of an uppermost insulating layer in the at least one upper insulating layer, the second pad may be formed on a bottom surface of a lowermost insulating layer in the at least one lower insulating layer, the upper via and the lower via may be distinguished based on a position of the base pad, and the base insulating layer, the upper insulating layer and the lower insulating layer may have no pad connected to the upper via and the lower via except for the first pad, the second pad and the base pad.

According to the embodiment, the via hole having a novel shape can be developed and the PCB having the via can be manufactured, so that the lead time can be reduced and the process cost can be saved.

In addition, according to the embodiment, the vias can be simultaneously formed in a plurality of layers, so the alignment of the vias formed in the layers can be improved.

Further, according to the embodiment, the dimple phenomenon can be diminished by the via having the novel shape, so the reliability of the PCB can be improved.

In addition, according to the embodiment, additional pads except for a base pad may not be necessary, so the degree of freedom can be increased when designing the PCB.

Further, according to the embodiment, the via holes can be formed by opening a plurality of layers at a time, and the vias can be formed by filling the via holes, so the lead time can be reduced and the process cost can be saved.

In addition, according to the embodiment, since the vias can be simultaneously formed in a plurality of layers, the alignment of the vias formed in the layers can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A printed circuit board comprising:
a base insulating layer;
a plurality of upper insulating layers on the base insulating layer;
a plurality of lower insulating layers under the base insulating layer;
a first pad on a top surface of an uppermost insulating layer in the plurality of upper insulating layers;
a second pad on a bottom surface of a lowermost insulating layer in the plurality of lower insulating layers;
a base on a top surface or a bottom surface of the base insulating layer;
an upper via formed commonly through the upper insulating layers in a vertical direction; and
a lower via formed commonly through the lower insulating layers in a vertical direction, wherein the upper via includes a plurality of upper via parts which are at least partially overlapped with each other in a horizontal direction, wherein the lower via includes a plurality of lower via parts which are at least partially overlapped with each other in a horizontal direction, wherein the lower via has an area larger than the upper via, wherein a width of a top surface of the upper via is wider than a width of a bottom surface of the upper via, wherein a width of a top surface of the lower via is wider than the width of the top surface of the upper via, wherein a width of a bottom surface of the lower via is wider than the width of the top surface of the lower via, wherein the plurality of upper insulating layers includes a first upper insulating layer on the base insulating layer, and a second upper insulating layer on the first upper insulating layer, wherein the upper via includes a first portion formed through the first upper insulating layer, and a second portion formed through the second upper insulating layer, wherein, a width of a top surface of the first portion is equal to a width of a bottom surface of the second portion, wherein a vertical cross section of the first portion and the second portion together has a trapezoidal shape, wherein the plurality of lower insulating layers includes a first lower insulating layer below the base insulating layer, and a second lower insulating layer below the first lower insulating layer, wherein the lower via includes a third portion formed through the first lower insulating layer, and a fourth portion formed through the second lower insulating layer, wherein a width of a bottom surface of the third portion is equal to a width of a top surface of the fourth portion, wherein a vertical cross section of the third portion and the fourth portion together has a trapezoidal shape, wherein top surfaces of the upper via parts commonly contact a bottom surface of the first pad, wherein bottom surfaces of the upper via parts commonly contact a top surface of the base pad, wherein top surfaces of the lower via parts commonly contact a bottom surface of the base pad, and wherein bottom surfaces of the lower via parts commonly contact a top surface of the second pad.

2. The printed circuit board of claim 1, wherein an upper section of each of the upper via parts and the lower via parts has a loop shape.

3. The printed circuit board of claim 1, wherein the upper via parts include:
   a first upper via part formed through the upper insulating layers; and
   a second upper via part adjacent to the first upper via part, and formed through the upper insulating layers, wherein a side part of the first upper via part is overlapped with a side part of the second upper via part, wherein the side part of the first upper via part is in direct physical contact with the side part of the second upper via part.

4. The printed circuit board of claim 3, wherein the lower via parts include:
   a first lower via part formed through the lower insulating layers; and
   a second lower via part adjacent to the first lower via part and formed through the lower insulating layers, wherein a side part of the first lower via part is overlapped with a side part of the second lower via part, wherein the side part of the first lower via part is in direct physical contact with the side part of the second lower via part.

5. The printed circuit board of claim 1, wherein the top surfaces of the upper via parts lie in the same plane as the top surface of the uppermost insulating layer, and
   wherein bottom surfaces of the lower via parts lie in the same plane as the bottom surface of the lowermost insulating layer.

6. The printed circuit board of claim 5, wherein the upper via and the lower via are distinguished based on a position of the base pad, and wherein the base insulating layer, the upper insulating layer and the lower insulating layer have no pad connected to the upper via and the lower via except for the first pad, the second pad and the base pad.

* * * * *